(12) United States Patent
Kanamori et al.

(10) Patent No.: US 11,374,017 B2
(45) Date of Patent: Jun. 28, 2022

(54) THREE-DIMENSIONAL MEMORY DEVICE INCLUDING A STRING SELECTION LINE GATE ELECTRODE HAVING A SILICIDE LAYER

(71) Applicant: SAMSUNG ELECTRONICS CO., LTD., Suwon-si (KR)

(72) Inventors: Kohji Kanamori, Suwon-si (KR); Seogoo Kang, Suwon-si (KR); Jongseon Ahn, Suwon-si (KR); Jeehoon Han, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 93 days.

(21) Appl. No.: 16/842,055

(22) Filed: Apr. 7, 2020

(65) Prior Publication Data

US 2021/0091093 A1    Mar. 25, 2021

(30) Foreign Application Priority Data

Sep. 24, 2019  (KR) ........................ 10-2019-0117285

(51) Int. Cl.

| | |
|---|---|
| *H01L 27/1157* | (2017.01) |
| *H01L 27/11524* | (2017.01) |
| *H01L 27/11556* | (2017.01) |
| *H01L 27/11529* | (2017.01) |
| *H01L 27/11565* | (2017.01) |
| *H01L 27/11573* | (2017.01) |
| *H01L 29/49* | (2006.01) |
| *H01L 21/28* | (2006.01) |

(Continued)

(52) U.S. Cl.
CPC .... *H01L 27/1157* (2013.01); *H01L 21/28052* (2013.01); *H01L 27/11519* (2013.01); *H01L 27/11524* (2013.01); *H01L 27/11529* (2013.01); *H01L 27/11556* (2013.01); *H01L 27/11565* (2013.01); *H01L 27/11573* (2013.01); *H01L 27/11582* (2013.01); *H01L 29/4933* (2013.01)

(58) Field of Classification Search
None
See application file for complete search history.

(56) References Cited

U.S. PATENT DOCUMENTS

| | | |
|---|---|---|
| 7,927,926 B2 | 4/2011 | Katsumata et al. |
| 8,189,371 B2 | 5/2012 | Katsumata et al. |
| 8,847,302 B2 | 9/2014 | Alsmeier et al. |

(Continued)

OTHER PUBLICATIONS

Office Action dated Feb. 15, 2022 in corresponding German Patent Application No. 10-2020-113935.7, 18 pages, with English language translation.

*Primary Examiner* — Hsien Ming Lee
(74) *Attorney, Agent, or Firm* — F. Chau & Associates, LLC

(57) ABSTRACT

A three-dimensional memory device is provided. The three-dimensional memory device may include a substrate, a cell stack, a string selection line gate electrode, a lower vertical channel structure, an upper vertical channel structure, and a bit line. The string selection line gate electrode may include a lower string selection line gate electrode and an upper string selection line gate electrode formed on an upper surface of the lower string selection line gate electrode. The lower string selection line gate electrode may include N-doped poly-crystalline silicon. The upper string selection line gate electrode may include silicide.

19 Claims, 31 Drawing Sheets

(51) Int. Cl.
   *H01L 27/11519*    (2017.01)
   *H01L 27/11582*    (2017.01)

(56) References Cited

U.S. PATENT DOCUMENTS

| | | |
|---|---|---|
| 9,041,090 B2 | 5/2015 | Simsek-Ege et al. |
| 9,362,302 B1 | 6/2016 | Lai |
| 9,466,611 B2 | 10/2016 | Komori et al. |
| 9,559,113 B2 | 1/2017 | Lai |
| 2010/0193861 A1* | 8/2010 | Shim ................ H01L 27/11556 257/329 |
| 2016/0365356 A1 | 12/2016 | Jung et al. |
| 2017/0207221 A1* | 7/2017 | Kim .................. H01L 27/11573 |
| 2017/0317096 A1 | 11/2017 | Shin et al. |
| 2017/0352679 A1 | 12/2017 | Chen |

\* cited by examiner

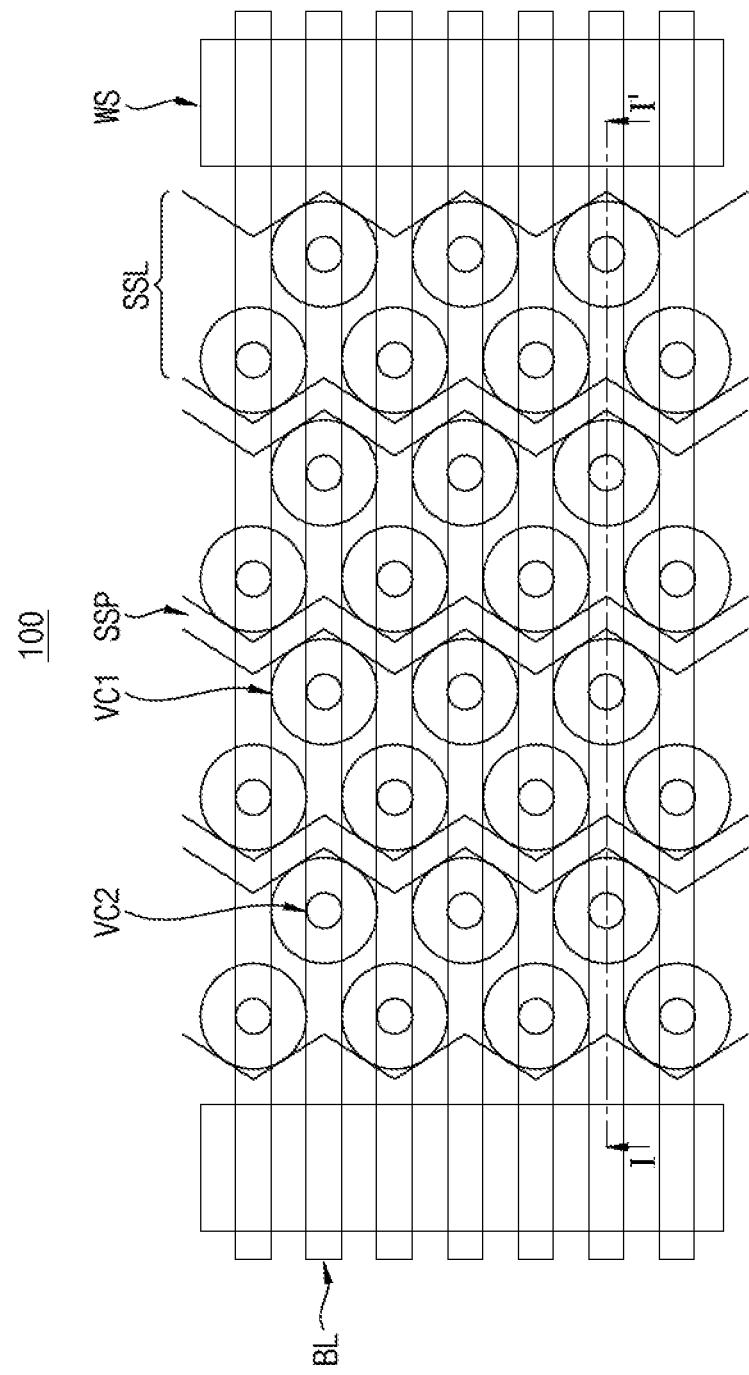

THREE-DIMENSIONAL MEMORY DEVICE INCLUDING A STRING SELECTION LINE GATE ELECTRODE HAVING A SILICIDE LAYER

CROSS-REFERENCE TO RELATED APPLICATION

This U.S. nonprovisional application claims priority under 35 U.S.C § 119 to Korean Patent Application No. 10-2019-0117285, filed on Sep. 24, 2019, in the Korean Intellectual Property Office, the disclosure of which is incorporated by reference herein in its entirety.

TECHNICAL FIELD

The present disclosure relates to a three-dimensional memory device including a string selection line gate electrode having a silicide layer.

DISCUSSION OF RELATED ART

As the stack height of memory cells and word lines of a three-dimensional memory device increases, a technique of forming a string selection line through additional processes has been proposed. Since the proposed string selection line formed through these additional processes is made of poly-crystalline silicon which has a resistance much higher than that of metals, the three-dimensional memory device as formed may have difficulty in achieving low power and high speed operation.

SUMMARY

Exemplary embodiments of the present disclosure provide a three-dimensional memory device including a string selection line gate electrode having a low resistance, and a method of manufacturing the three-dimensional memory device.

A three-dimensional memory device according to an exemplary embodiment of the present disclosure may include a substrate, a cell stack disposed on the substrate, a string selection line gate electrode disposed on the cell stack, a lower vertical channel structure vertically penetrating the cell stack, an upper vertical channel structure vertically penetrating the string selection line gate electrode and being connected to the lower vertical channel structure, and a bit line disposed on the upper vertical channel structure. The string selection line gate electrode may include a lower string selection line gate electrode and an upper string selection line gate electrode formed on an upper surface of the lower string selection line gate electrode. The lower string selection line gate electrode may include N-doped poly-crystalline silicon. The upper string selection line gate electrode may include silicide.

A three-dimensional memory device according to an exemplary embodiment of the present disclosure may include a substrate, a common source layer disposed on the substrate, a cell stack disposed on the common source layer, a string selection line gate electrode disposed on the cell stack, a lower vertical channel structure vertically penetrating the cell stack and being connected to the common source layer, an upper vertical channel structure vertically penetrating the string selection line gate electrode and being connected to the lower vertical channel structure, a pad pattern disposed on the upper vertical channel structure, and a bit line disposed on the pad pattern. The pad pattern may include a lower pad pattern and an upper pad pattern formed on the lower pad pattern. The lower pad pattern may include N-doped poly-crystalline silicon. The upper pad pattern may include silicide.

A three-dimensional memory device according to an exemplary embodiment of the present disclosure may include a substrate, a logic circuit layer disposed on the substrate, the logic circuit layer including a transistor, a metal interconnection, and a lower insulating layer covering the transistor and the metal interconnection, a common source layer disposed on the logic circuit layer, a cell stack disposed on the common source layer, a lower vertical channel structure vertically penetrating the cell stack and being connected to the common source layer, a string selection line gate electrode disposed on the cell stack and the lower vertical channel structure, an upper vertical channel structure vertically penetrating the string selection line gate electrode and being connected to the lower vertical channel structure, a pad pattern disposed on the upper vertical channel structure, and a bit line disposed on the pad pattern. The pad pattern may include a lower pad pattern and an upper pad pattern formed on the lower pad pattern. The string selection line gate electrode may include a lower string selection line gate electrode and an upper string selection line gate electrode formed on the lower string selection line gate electrode. The lower pad pattern and the lower string selection line gate electrode may include N-doped poly-crystalline silicon. The upper pad pattern and the upper string selection line gate electrode may include silicide.

A method of forming a three-dimensional memory device according to an exemplary embodiment of the present disclosure may include forming a mold stack including mold layers and sacrificial layers on a substrate, forming a lower vertical channel structure vertically penetrating the mold stack, forming a string selection line gate electrode on the mold stack and the lower vertical channel structure, forming an upper vertical channel structure vertically penetrating the string selection line gate electrode and being connected to the lower vertical channel structure, forming a pad pattern on the upper vertical channel structure, and forming a bit line on the pad pattern. The forming of the string selection line gate electrode may include forming a preliminary string selection line gate electrode including N-doped poly-crystalline silicon, and siliciding an upper portion of the preliminary string selection line gate electrode to form a lower string selection line gate electrode containing the N-doped poly-crystalline silicon and an upper string selection line gate electrode including silicide.

A method of forming a three-dimensional memory device according to an exemplary embodiment of the present disclosure may include forming a common source layer on the substrate, forming a mold stack on the common source layer, forming a lower vertical channel structure vertically penetrating the mold stack and being connected with the common source layer, forming a string selection line gate electrode on the mold stack, forming an upper vertical channel structure vertically penetrating the string selection line gate electrode and being connected to the lower vertical channel structure, forming a pad pattern on the upper vertical channel structure, and forming a bit line on the pad pattern. The forming of the string selection line gate electrode may include forming a preliminary string selection line gate electrode comprising N-doped poly-crystalline silicon, and siliciding an upper portion of the preliminary string selection line gate electrode to form a lower string selection line gate electrode including N-doped poly-crystalline silicon and an upper string selection line gate electrode including silicide. The forming of the pad pattern may include forming a preliminary pad pattern including N-doped poly-crystalline silicon and siliciding an upper portion of the preliminary pad pattern to form a lower pad pattern including N-doped poly-crystalline silicon and an upper pad pattern including silicide.

A method of forming a three-dimensional memory device according to an exemplary embodiment of the present disclosure may include forming a logic circuit layer on a substrate, the logic circuit layer including a transistor, a metal interconnection, and a lower insulating layer covering the transistor and the metal interconnection, forming a common source layer on the logic circuit layer, forming a mold stack on the common source layer, forming a lower vertical channel structure vertically penetrating the mold stack and being connected with the common source layer, forming a string selection line gate electrode on the mold stack and the lower vertical channel structure, forming an upper vertical channel structure vertically penetrating the string selection line gate electrode and being connected to the lower vertical channel structure, forming a pad pattern on the upper vertical channel structure, and forming a bit line on the pad pattern. The forming of the string selection line gate electrode may include forming a preliminary string selection line gate electrode including N-doped poly-crystalline silicon, and siliciding an upper portion of the preliminary string selection line gate electrode to form a lower string selection line gate electrode including N-doped poly-crystalline silicon and an upper string selection line gate electrode including silicide.

BRIEF DESCRIPTION OF THE DRAWINGS

The above and other aspects and features of the present disclosure will become more apparent by describing in detail exemplary embodiments thereof with reference to the accompanying drawings, in which:

FIG. 1 is a layout of a three-dimensional memory device 100 according to an exemplary embodiment of the present disclosure;

FIGS. 2A to 2I are longitudinal cross-sectional views of three-dimensional memory devices 100A-100I each according to an exemplary embodiment of the present disclosure;

FIGS. 6 to 21 are enlarged views of region A of FIG. 5;

Figure 2A:
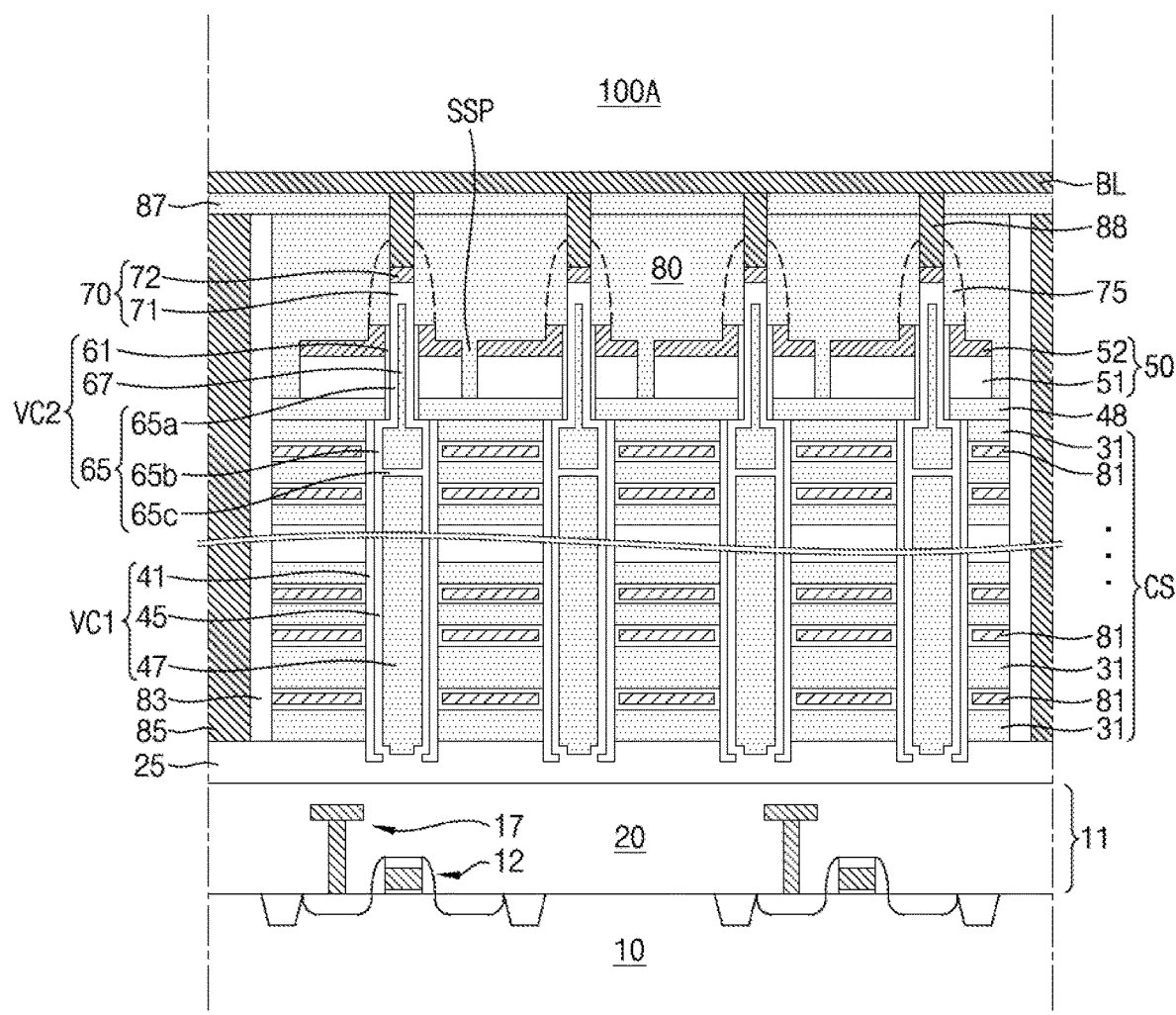

Since the drawings in FIGS. 1-37 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

FIG. 1 is a layout of a three-dimensional memory device 100 according to an exemplary embodiment of the present disclosure.

Referring to FIG. 1, the three-dimensional memory device 100 according to an exemplary embodiment of the present disclosure may include a plurality of vertical channel structures VC1 and VC2, word line separation structures WS, string selection lines SSL, string selection line separation patterns SSP, and bit lines BL.

The plurality of vertical channel structures VC1 and VC2 may have a circular shape in a plan view, and may be arranged in a zigzag shape. The plurality of vertical channel structures VC1 and VC2 may include a lower vertical channel structure VC1 and an upper vertical channel structure VC2, respectively. The lower vertical channel structure VC1 may have a larger diameter than the upper vertical channel structure VC2. The lower vertical channel structure VC1 and the upper vertical channel structure VC2 may be arranged to completely overlap. For example, in an exemplary embodiment of the present disclosure, the upper vertical channel structure VC2 may be completely overlapped by the lower vertical channel structure VC1, and a portion of the lower vertical channel structure VC1 may not be overlapped by the upper vertical channel structure VC2. In an exemplary embodiment of the present disclosure, the lower vertical channel structure VC1 and the upper vertical channel structure VC2 may overlap and be arranged concentrically. In an exemplary embodiment of the present disclosure, the lower vertical channel structure VC1 and the upper vertical channel structure VC2 may overlap and be arranged in an eccentric shape.

The string selection lines SSL may be electrically and physically separated by the string selection line separation patterns SSP. For example, the string selection lines SSL may surround the upper vertical channel structures VC2 arranged in two rows. The string selection line separation patterns SSP may have a wavy or zigzag shape in a plan view. In an exemplary embodiment of the present disclosure, the string selection lines SSL may be formed at one level or a plurality of levels. For example, the string selection lines SSL may be formed at an uppermost level, or at an uppermost level and one level directly under the uppermost level above a cell stack CS including a plurality of word lines located at different levels to be described.

The bit lines BL may extend in a direction perpendicular to an extending direction of the string selection lines SSL and the string selection line separation patterns SSP. For example, the bit lines BL may extend in a row direction, and the string selection lines SSL and the string selection line separation patterns SSP may extend in a column direction. For example, the string selection line separation patterns SSP may extend in a column direction not in a straight line but with a wave shape or a zigzag shape. The bit lines BL may overlap the upper vertical channel structures VC2 arranged on the same line in the row direction. For example, a plurality of upper vertical channel structures VC2 arranged on the same line with the bit line BL may each be electrically connected to the bit line BL thereabove.

The word line separation structure WS may extend in the column direction. The above-described elements will be described in more detail with reference to other drawings.

FIGS. 2A to 2I are longitudinal cross-sectional views of three-dimensional memory devices 100A-100I each according to an exemplary embodiment of the present disclosure, for example, longitudinal cross-sectional views taken along line I-I' of FIG. 1.

Referring to FIG. 2A, a three-dimensional memory device 100A according to an exemplary embodiment of the present disclosure may include a logic circuit layer 11, a common source layer 25, a cell stack CS, and a lower vertical channel structure VC1, an upper vertical channel structure VC2, a string selection line gate electrode 50, a string selection line separation pattern SSP, a pad pattern 70, a pad spacer 75, an upper insulating layer 80, a capping insulating layer 87, a via plug 88, and a bit line BL disposed on a substrate 10. The three-dimensional memory device 100A may further include a lower buffer insulating layer 48 located between the cell stack CS and the string selection line gate electrode 50, a word line separation insulating layer 83 separating the cell stack CS, and a common source plug 85 connected with the common source layer 25.

The substrate 10 may include a silicon (Si) wafer. In an exemplary embodiment of the present disclosure, the substrate 10 may include an epitaxially grown material layer, such as, for example, a silicon (Si) layer, a silicon germanium (SiGe) layer, or a silicon carbide (SiC) layer. In an exemplary embodiment of the present disclosure, the substrate 10 may include a silicon-on-insulator (SOI). In an exemplary embodiment of the present disclosure, the substrate 10 may include a III-V compound such as, for example, gallium phosphide (GaP), gallium arsenide (GaAs), gallium antimonide (GaSb), or the like.

The logic circuit layer 11 may include a transistor 12, a metal interconnection 17, and a lower insulating layer 20. For example, the transistor 12 may include a source/drain region and a channel region formed in an active region defined by an isolation region, and may include a gate insulating layer, a gate electrode, a gate capping layer, and a gate spacer formed on the substrate 10. The metal interconnection 17 may include a contact plug pattern extending vertically and a horizontal line pattern extending horizontally. The contact plug pattern of the metal interconnection 17 may be in contact with the source/drain region of the transistor 12.

The lower insulating layer 20 may cover the transistor 12 and the metal interconnection 17, and may include at least one of, for example, a silicon oxide ($SiO_2$) layer, a silicon nitride ($Si_3N_4$) layer, or a combination thereof.

The common source layer 25 may be formed to extend horizontally on the lower insulating layer 20. For example, the common source layer 25 may include N-doped poly-crystalline silicon (p-Si). In a plan view, the common source layer 25 may have a plate shape or a line shape.

The cell stack CS may be disposed on the common source layer 25, and may include a plurality of mold layers 31 and a plurality of word lines 81 stacked alternately. The mold layers 31 may include silicon oxide ($SiO_2$). The plurality of word lines 81 may each include a barrier layer and an electrode layer. The barrier layer may include a blocking insulation layer and a diffusion barrier layer. For example, the blocking insulation layer may include an insulator having a relatively high work function, such as aluminum oxide ($Al_2O_3$). The diffusion barrier layer may include a conductive metal compound, such as titanium nitride (TiN). The electrode layer may include a metal such as tungsten (W).

The barrier layer and electrode layer will be described again with reference to other drawings.

The string selection line gate electrode 50 may be disposed on the cell stack CS. The string selection line gate electrode 50 may include a lower string selection line gate electrode 51 and an upper string selection line gate electrode 52. Sidewalls of the lower string selection line gate electrode 51 and sidewalls of the upper string selection line gate electrode 52 may be vertically aligned. In this specification, the word "sidewalls" may mean "a sidewall" and vice versa. The string selection line separation pattern SSP may be in contact with sidewalls of the lower string selection line gate electrode 51 and sidewalls of the upper string selection line gate electrode 52. The lower string selection line gate electrode 51 may include N-doped poly-crystalline silicon containing phosphorus (P) and/or arsenic (As). The upper string selection line gate electrode 52 may include a metal silicide. For example, the upper string selection line gate electrode 52 may be an upper portion of the string selection line gate electrode 50 and the lower string selection line gate electrode 51 may be a lower portion of the string selection line gate electrode 50. The upper string selection line gate electrode 52 may include at least one of, for example, nickel silicide (NiSi), titanium silicide (TiSi), cobalt silicide (CoSi), tungsten silicide (WSi), or other metal silicide material. Since the upper string selection line gate electrode 52 that has a metal silicide is formed on an upper surface of the lower string selection line gate electrode 51 including N-doped poly-crystalline silicon (p-Si), regardless of a distance spaced apart from another adjacent string selection line gate electrode 50, a metal silicide electrode of sufficient thickness can be formed. For example, a thick metal silicide electrode may be formed in an upper portion of each of two adjacent string selection line gate electrodes 50 having a small separation distance therebetween. Thus, the electrical resistance of the string selection line gate electrode 50 may be lowered due to the formation of the metal silicide that is more conductive than the N-doped poly-crystalline silicon (p-Si). The upper surface of the upper string selection line gate electrode 52 may include a protruding portion and a recessed portion. For example, a portion adjacent to the upper vertical channel structure VC2 may protrude, and a portion spaced apart from the upper vertical channel structure VC2 may be recessed. In a plan view, the protruding portion of the upper string selection line gate electrode 52 may have a disc shape surrounding the upper vertical channel structure VC2.

The lower buffer insulating layer 48 disposed between the cell stack CS and the string selection line gate electrode 50 may include silicon oxide ($SiO_2$).

The string selection line separation pattern SSP may be disposed between the string selection line gate electrodes 50 to physically and materially separate the string selection line gate electrodes 50. Further referring to FIG. 1, the string selection line separation pattern SSP may extend in a wave shape or a zigzag shape in the column direction. Accordingly, the string selection line separation pattern SSP may have a dam shape or a wall shape. The string selection line separation pattern SSP may include silicon oxide ($SiO_2$). In an exemplary embodiment of the present disclosure, the string selection line separation pattern SSP may include a material the same as that of the lower buffer insulating layer 48.

The lower vertical channel structure VC1 may have a pillar shape that vertically penetrates the cell stack CS (for example, the mold layers 31 and the word lines 81) to be connected to the common source layer 25, and may include a memory layer 41, a lower channel layer 45, and a lower gap-fill pattern 47. The lower channel layer 45 may surround the lower gap-fill pattern 47 and the memory layer 41 may surround the lower channel layer 45. For example, the lower vertical channel structure VC1 may include the memory layer 41 conformally formed on inner walls of the lower vertical channel hole that vertically penetrates mold layers 31 and the word lines 81 to expose the common source layer 25, the lower channel layer 45 conformally formed on inner walls of the memory layer 41, and the lower gap-fill pattern 47 formed on inner walls of the lower channel layer 45 to fill the lower vertical channel hole. The memory layer 41 will be described in more detail with reference to other drawings.

The lower channel layer 45 may include undoped poly-crystalline silicon (p-Si). The bottom end of the lower vertical channel structure VC1 may protrude into the common source layer 25. For example, the memory layer 41, the lower channel layer 45, and the lower gap-fill pattern 47 may extend into the common source layer 25, and the lower channel layer 45 may be connected with the common source layer 25. An upper portion of the lower gap-fill pattern 47 may be located at a level lower than that of an upper portion of the memory layer 41.

The upper vertical channel structure VC2 may vertically penetrate the string selection line gate electrode 50 and the lower buffer insulating layer 48 to be connected to an upper portion of the lower vertical channel structure VC1, and may include an insulating liner 61, an upper channel layer 65, and an upper gap-fill pattern 67. The upper channel layer 65 may surround sidewalls of the upper gap-fill pattern 67, and the insulating liner 61 may surround sidewalls of the upper channel layer 65. The upper vertical channel structure VC2 may include a lower portion having a first width and an upper portion having a second width, with the first width larger than the second width.

The insulating liner 61 may be disposed between the upper channel layer 65 and the string selection line gate electrode 50 to surround the sidewalls of the upper channel layer 65. The insulating liner 61 may include silicon oxide ($SiO_2$) or a high-k dielectric layer such as hafnium oxide ($HfO_2$). For example, the string selection line gate electrode 50 may be a string selection line SSL (see FIG. 1), and the insulating liner 61 may be a gate insulating layer of the string selection line gate electrode 50.

The upper channel layer 65 may include a first upper channel layer 65*a* vertically extending between the string selection line gate electrodes 50, a second upper channel layer 65*b* conformally vertically formed on inner walls of the memory layer 41 of the upper portion of the lower vertical channel structure VC1, and a third upper channel layer 65*c* conformally horizontally formed on an upper surface of the lower gap-fill pattern 47 of the lower vertical channel structure VC1. For example, the first upper channel layer 65*a* and the second upper channel layer 65*b* may extend vertically, and the third upper channel layer 65*c* may extend horizontally. The lower channel layer 45 and the second upper channel layer 65*b* may be vertically aligned. For example, the insulating liner 61 may surround sidewalls of the first upper channel layer 65*a* such that the insulating liner 61 and the first upper channel layer 65*a* may directly contact each other. The memory layer 41 may surround sidewalls of the second upper channel layer 65*b* such that the memory layer 41 and second upper channel layer 65*b* may directly contact each other. The third upper channel layer 65*c* may be disposed between the lower gap-fill pattern 47 and the upper gap-fill pattern 67 such that the third upper channel layer 65*c* and the lower gap-fill pattern 47 may directly contact each other. Therefore, the lower gap-fill pattern 47 and the upper gap-fill pattern 67 may be separated by the third upper channel layer 65*c*. In an exemplary embodiment of the present disclosure, the upper portion of the upper channel layer 65, (e.g., the upper portion of the first upper channel layer 65*a*) may include N-type impurities, for example, N-doped poly-crystalline silicon (p-Si). The lower portion of the first upper channel layer 65*a*, the second upper channel layer 65*b*, and the third upper channel layer 65*c* may include undoped poly-crystalline silicon (p-Si).

The memory layer 41 may surround an outer wall of the lower channel layer 45 and an outer wall of the second upper channel layer 65*b*. The second upper channel layer 65*b* may extend horizontally onto a lower surface of the lower buffer insulating layer 48 to be connected to the first upper channel layer 65*a*. For example, the second upper channel layer 65*b* may extend vertically on the inner walls of the memory layer 41 of the upper portion of the lower vertical channel structure VC1, and may bend and extend on a top surface of the lower gap-fill pattern 47 of the lower vertical channel structure VC1. The second upper channel layer 65*b* and/or the third upper channel layer 65*c* may be connected to the lower channel layer 45. For example, the upper channel layer 65 may have a decanter shape or a flagon shape. The upper gap-fill pattern 67 may be surrounded by the upper channel layer 65. The upper gap-fill pattern 67 may include a lower portion having a relatively wide width (or diameter) and a small height, and an upper portion having a relatively narrow width (or diameter) and a large height. For example, the upper portion of the upper gap-fill pattern 67 may be surrounded by the first upper channel layer 65*a*, and the lower portion of the upper gap-fill pattern 67 may be surrounded by the second upper channel layer 65*b*. The upper portion of the upper gap-fill pattern 67 may have a third width narrower than a fourth width of the lower portion of the upper gap-fill pattern 67. For example, the lower portion of the upper gap-fill pattern 67 may have a horizontal width (or diameter) similar to that of the lower gap-fill pattern 47.

The pad pattern 70 may be disposed on the upper vertical channel structure VC2. For example, the pad pattern 70 may be disposed between the upper vertical channel structure VC2 and the bit line BL. The pad pattern 70 may include a lower pad pattern 71 and an upper pad pattern 72. Outer surfaces of the lower pad pattern 71, outer surfaces of the upper pad pattern 72, and outer surfaces of the first upper channel layer 65*a* may be vertically aligned. For example, the outer surfaces of the lower pad pattern 71, the outer surfaces of the upper pad pattern 72, and the outer surfaces of the first upper channel layer 65*a* may be vertically coplanar. The lower pad pattern 71 may include N-doped poly-crystalline silicon (p-Si), and the upper pad pattern 72 may include metal silicide. The lower pad pattern 71 and the upper channel layer 65 may include the same material, for example, N-doped poly-crystalline silicon (p-Si). In an exemplary embodiment of the present disclosure, the upper pad pattern 72 may be a silicided upper portion of the lower pad pattern 71. For example, metal silicide of the upper pad pattern 72 may be formed by the infiltration of a metal into an upper portion of a preliminary pad pattern to be described that includes N-doped poly-crystalline silicon (p-Si).

The bit line BL may include a metal such as tungsten (W). Referring to FIG. 1, the bit line BL may extend horizontally in the row direction. The via plug 88 may be disposed between the bit line BL and the upper vertical channel structure VC2. The via plug 88 may include a metal such as tungsten (W). The via plug 88 may be in direct contact with the upper pad pattern 72, and may have a pillar shape.

The pad spacer 75 may be disposed on a protruding portion of the upper string selection line gate electrode 52 to surround sidewalls of the upper portion of the upper vertical channel structure VC2. The pad spacer 75 may also surround sidewalls of the pad pattern 70 and sidewalls of the via plug 88. In a plan view, the pad spacer 75 may have a disk shape.

The upper insulating layer 80 may cover the string selection line gate electrode 50 and the pad spacer 75, and may surround sidewalls of the via plug 88. The upper insulating layer 80 may include a material the same as that of the string selection line separation pattern SSP. Therefore, an interface between the upper insulating layer 80 and the string selection line separation pattern SSP is omitted. For example, in this case, there is no interface between the upper insulating layer 80 and the string selection line separation pattern SSP.

The interface between the upper insulating layer 80 and the string selection line separation pattern SSP will be described with reference to other drawings.

The upper insulating layer 80 may include a material the same as that of the pad spacer 75. Therefore, an interface between the upper insulating layer 80 and the pad spacer 75 is indicated by a dotted line. For example, in this case, there is no real interface between the upper insulating layer 80 and the pad spacer 75.

The word line separation insulating layer 83 may be conformally formed on the sidewall of the word line separation trench that vertically penetrates the cell stack CS to expose the common source layer 25. The word line separation trench will be described with reference to other drawings.

The word line separation insulating layer 83 may include an insulating material such as, for example, silicon oxide (SiO$_2$), silicon nitride (Si$_3$N$_4$), silicon oxynitride (SiON), aluminum oxide (Al$_2$O$_3$), or other insulating material. Referring to FIG. 1, the word line separation insulating layer 83 may have a dam shape or a wall shape extending in the column direction along a border line of the word line separation structure WS.

The common source plug 85 may include a conductor surrounded by the word line separation insulating layer 83. For example, common source plug 85 may include a low resistance metal such as, for example, tungsten (W), titanium (Ti), tantalum (Ta), platinum (Pt), or other metal. Further referring to FIG. 1, the common source plug 85 may have a dam shape or a wall shape that fills the inside of the word line separation structure WS and extends in the column direction. The common source plug 85 may be electrically connected to the common source layer 25. In an exemplary embodiment of the present disclosure, the common source plug 85 may extend in the column direction to separate neighboring ones of the word lines 81, however, the common source plug 85 may be electrically insulated from the word lines 81 because sidewalls of the common source plug 85 may be covered by the word line separation insulating layer 83.

Since the upper portions of the string selection line gate electrode 50 and the pad pattern 70 are formed of metal silicide to have a resistance lower than that of poly-crystalline silicon (p-Si), and to prevent electrical bridging between adjacent components, the three-dimensional memory device 100A described above with reference to FIG. 2A may provide high performance and maintain reliability.

Figure 2B:
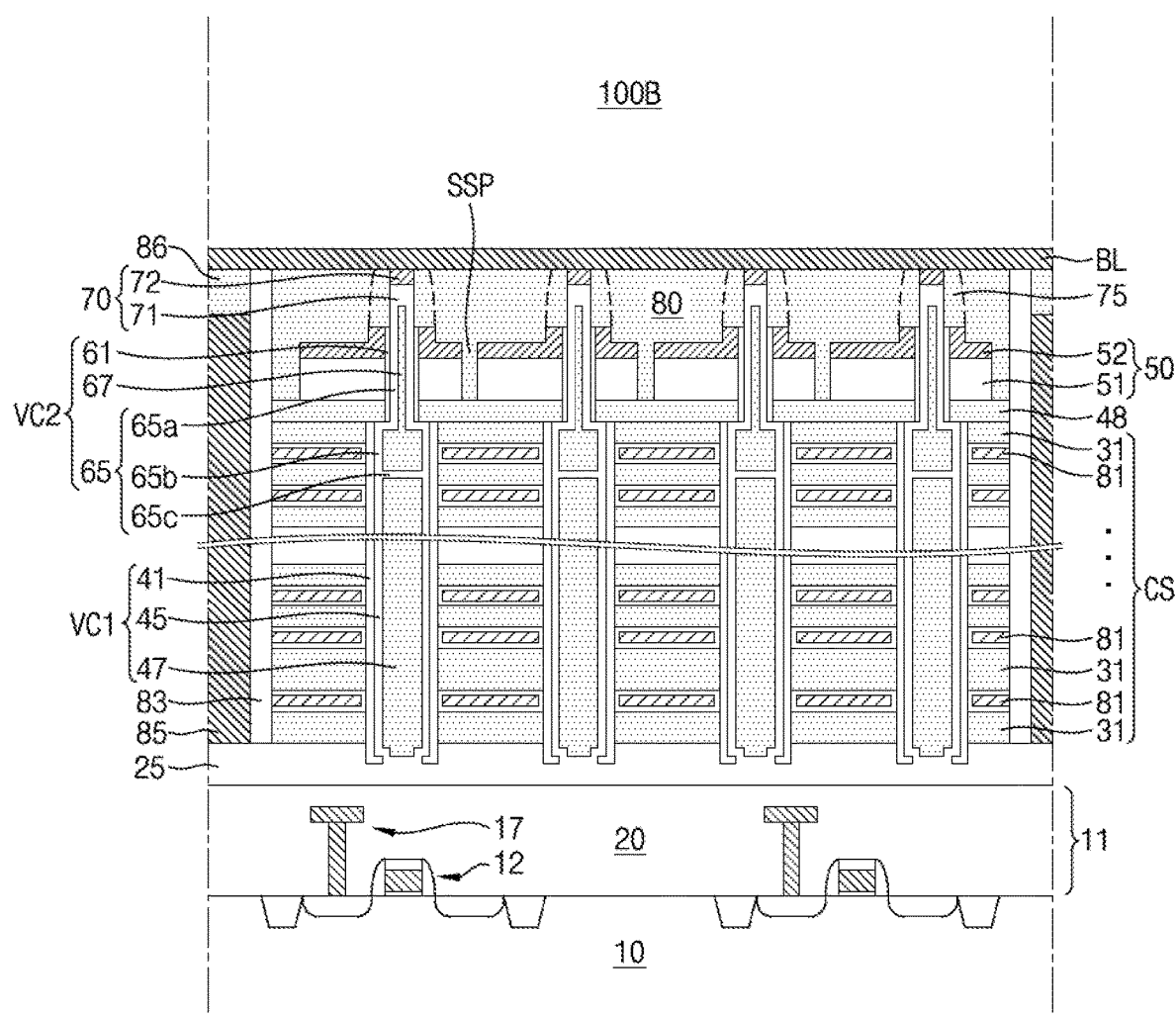

Referring to FIG. 2B, a three-dimensional memory device 100B according to an exemplary embodiment of the present disclosure may not include the capping insulating layer 87 and the via plug 88 in comparison with the three-dimensional memory device 100A shown in FIG. 2A. For example, in the three-dimensional memory device 100B, the capping insulating layer 87 and the via plug 88 may be omitted. The upper pad pattern 72 of the pad pattern 70 may be in direct contact with the bit line BL. The common source plug 85 may be recessed lower than the upper pad pattern 72 of the pad pattern 70. For example, the top surface of the common source plug 85 may be located at a level lower than a level of the bottom surface of the upper pad pattern 72. For example, different from the three-dimensional memory device 100A shown in FIG. 2A, the three-dimensional memory device 100B may further include a stopple insulating layer 86 disposed between the common source plug 85 and the bit line BL. Other, non-described elements may be understood with reference to FIG. 2A.

Figure 2C:
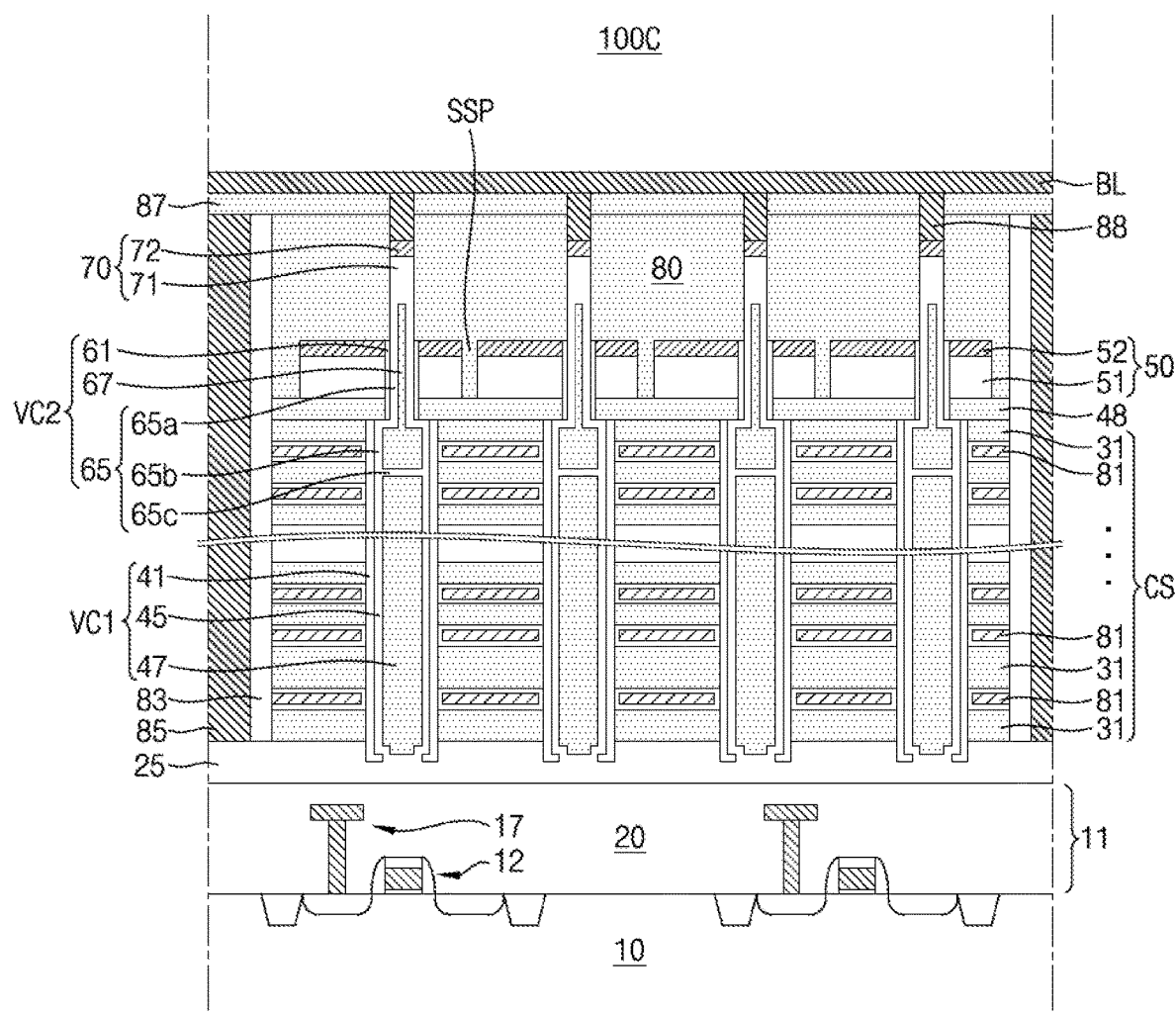

Referring to FIG. 2C, a three-dimensional memory device 100C according to an exemplary embodiment of the present disclosure may have an upper string selection line gate electrode 52 having a flat upper surface in comparison with the three-dimensional memory devices 100A and 100B shown in FIGS. 2A and 2B. For example, the upper surface of the upper string selection line gate electrode 52 of the string selection line gate electrode 50 may be flat without being recessed. Other, non-described elements may be understood with reference to FIGS. 2A and 2B.

Figure 2D:
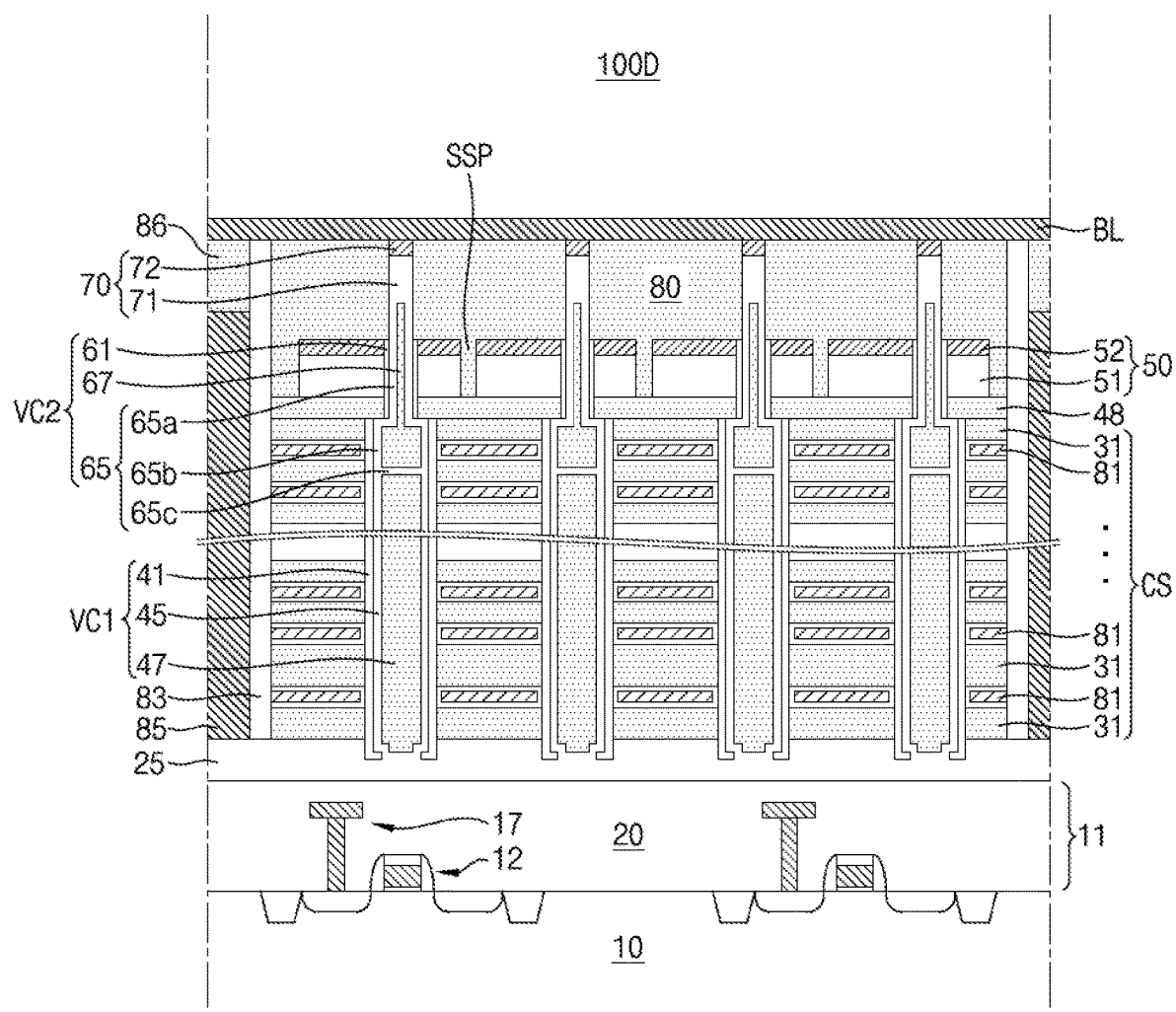

Referring to FIG. 2D, a three-dimensional memory device 100D according to an embodiment of the present disclosure may further include a stopple insulating layer 86 in comparison with the three-dimensional memory device 100C shown in FIG. 2C. The stopple insulating layer 86 may be disposed between the common source plug 85 and the bit line BL. The three-dimensional memory device 100D may not include the capping insulating layer 87 and the via plug 88 in comparison with the three-dimensional memory device 100C shown in FIG. 2C. The upper pad pattern 72 of the pad pattern 70 may be in direct contact with the bit line BL. The stopple insulating layer 86 may extend in the column direction with reference to FIG. 1. Other, non-described elements may be understood with reference to FIGS. 2A-2C.

Figure 2E:
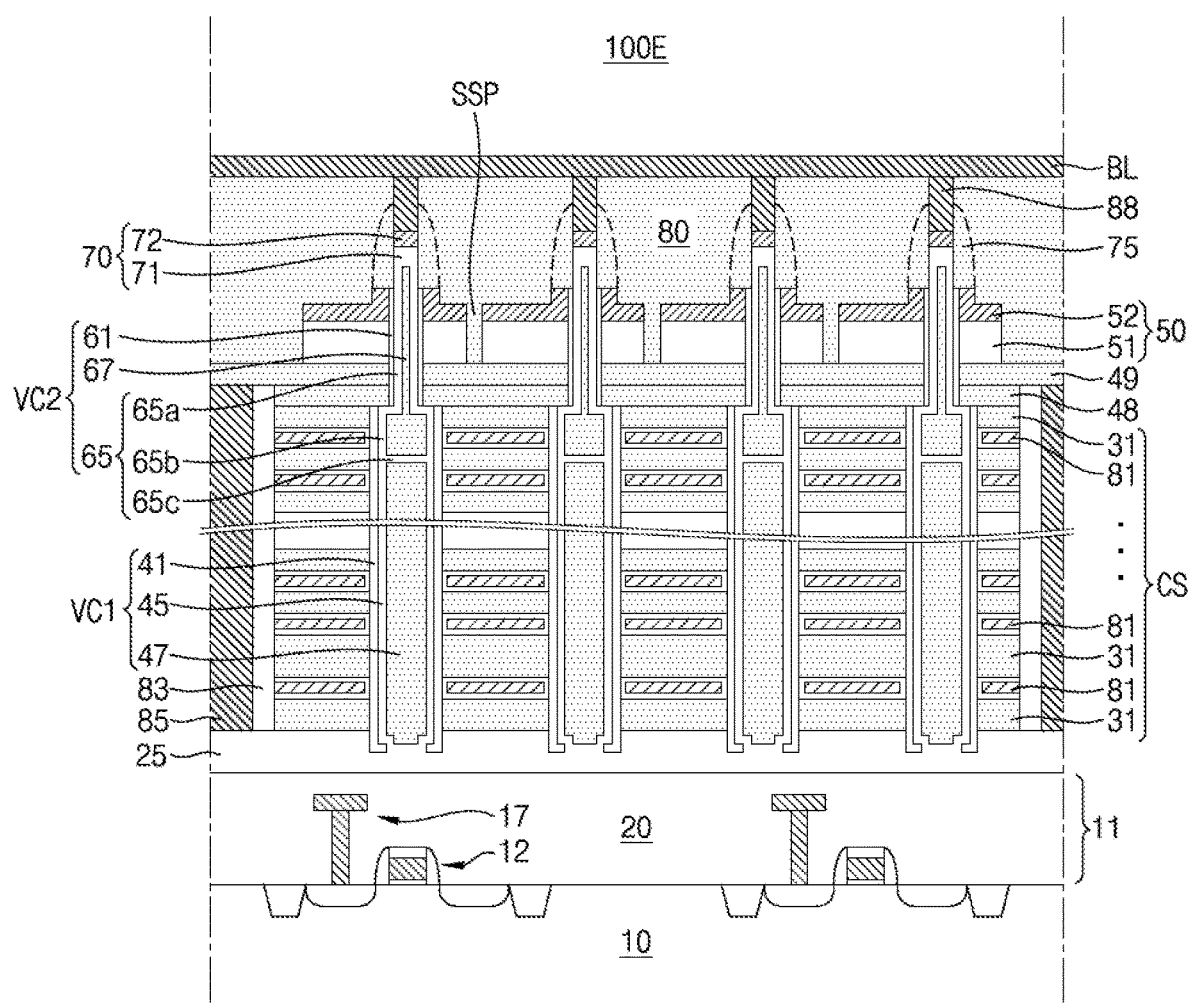
Figure 2F:
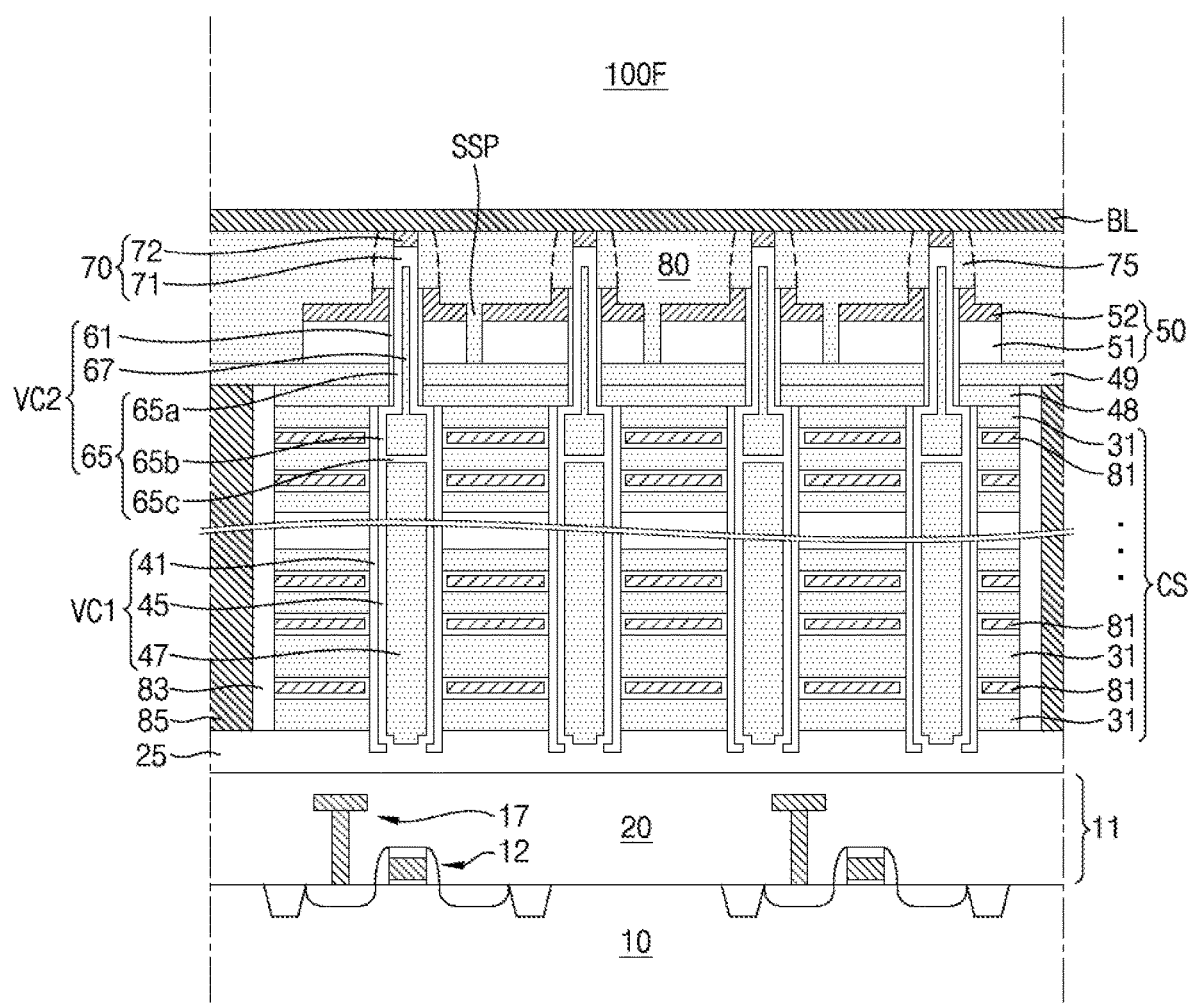

Referring to FIGS. 2E and 2F, three-dimensional memory devices 100E and 100F each according to an exemplary embodiment of the present disclosure may include a lower buffer insulating layer 48 and an upper buffer insulating layer 49 located between the lower vertical channel structure VC1 and the string selection line gate electrode 50 in comparison with the three-dimensional memory devices 100A-100D shown in FIGS. 2A to 2D, respectively. Top surfaces of the word line separation insulating layer 83 and the common source plug 85 and the top surface of the lower buffer insulating layer 48 may be coplanar. In FIG. 2F, the three-dimensional memory device 100F may not have the via plug 88 in comparison to the three-dimensional memory device 100E shown in FIG. 2E. Other, non-described elements may be understood with reference to FIGS. 2A-2D.

Figure 2G:
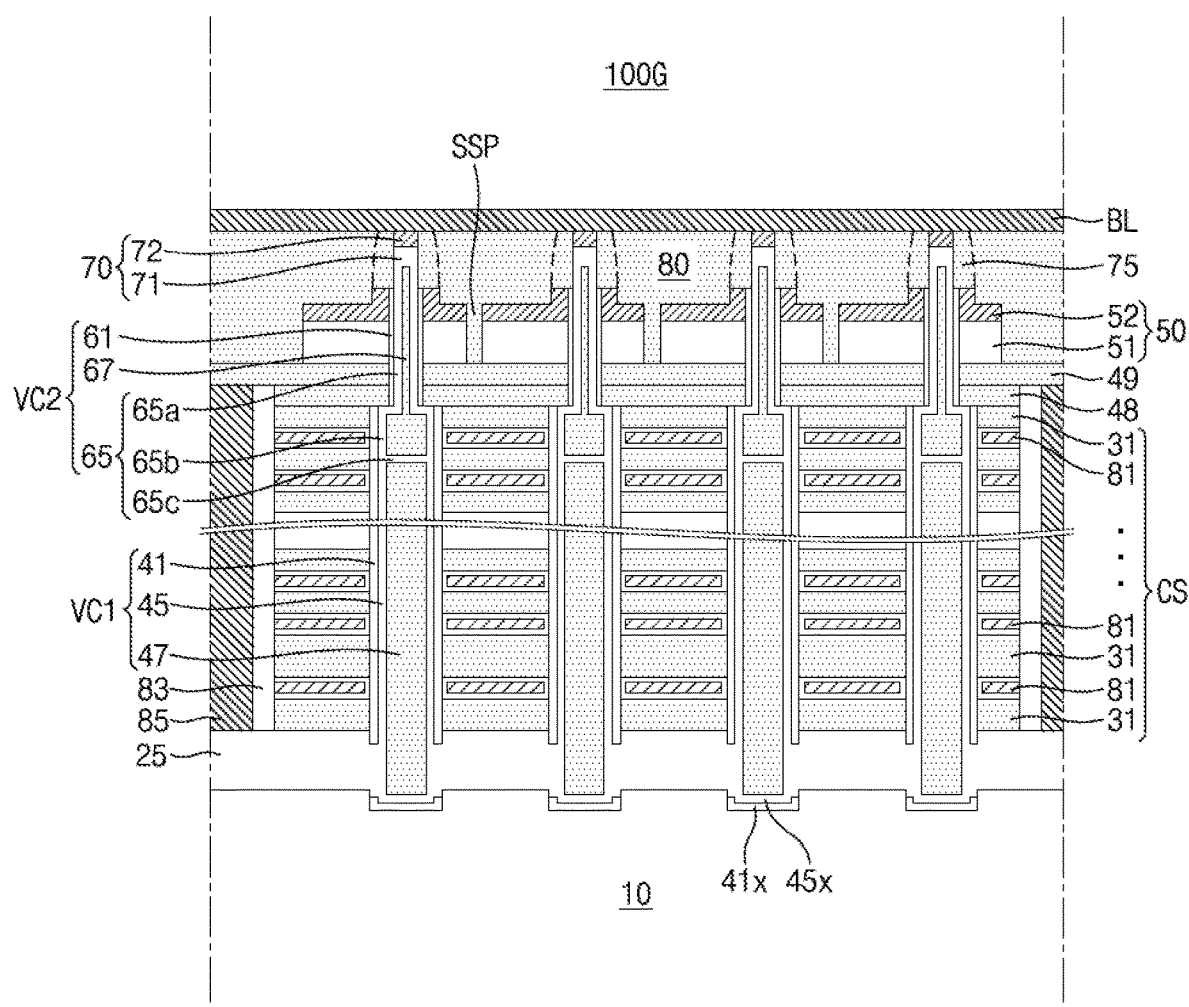
Figure 2H:
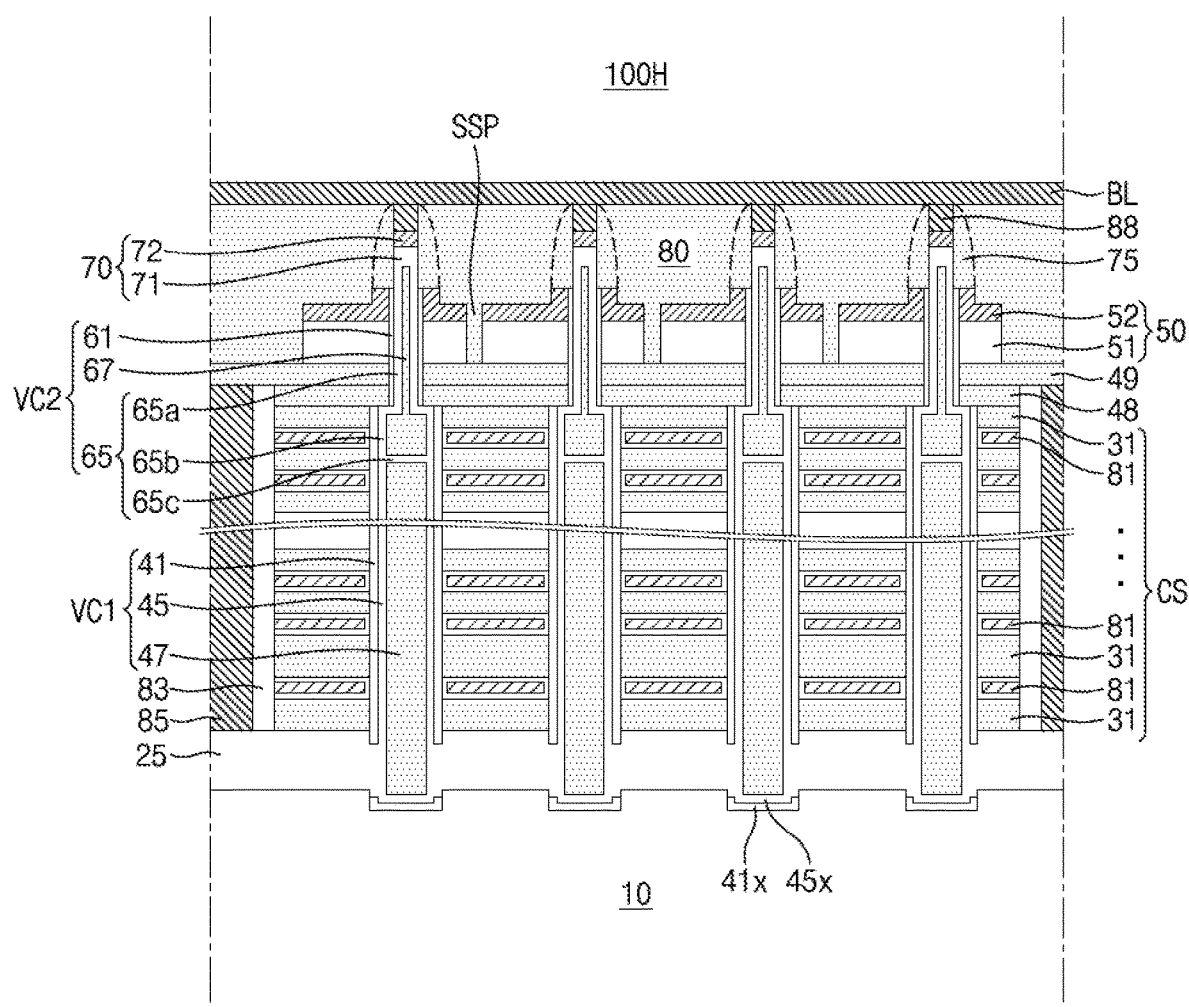

Referring to FIGS. 2G to 2I, three-dimensional memory devices 100G-100I each according to an exemplary embodiment of the present disclosure may not include the logic circuit layer 11 in comparison with the three-dimensional memory devices 100A-100F shown in FIGS. 2A to 2F. Further, the common source layer 25 may be formed directly on the substrate 10. For example, the common source layer 25 may be disposed between the substrate 10 and the cell stack CS with the logic circuit layer 11 interposed between the common source layer 25 and the substrate 10 as shown in FIGS. 2A-2F, or without the logic circuit layer 11 interposed between the common source layer 25 and the substrate 10 as shown in FIGS. 2G-2I. The lower channel layer 45 of the lower vertical channel structure VC1 and the common source layer 25 may be directly connected. A bottom memory layer 41x and a bottom lower channel layer

45*x* may be partially disposed at a bottom of the lower vertical channel structure VC1. The bottom memory layer 41*x* and the bottom lower channel layer 45*x* may protrude into the substrate 10. The memory layer 41 and the bottom memory layer 41*x* of the lower vertical channel structure VC1 may be separated by the common source layer 25. For example, the lower vertical channel structure VC1 may include a protruding portion protruding into the substrate 10, with the bottom memory layer 41*x* disposed at the protruding portion. The protruding portion of the lower vertical channel structure VC1 may be a recessed portion of the substrate 10. Referring to FIG. 2G, the bit line BL may be directly formed on the upper pad pattern 72. Referring to FIG. 2H, the via plug 88 may be formed between the upper pad pattern 72 and the bit line BL. Referring to FIG. 2I, the upper string selection line gate electrode 52 may have a flat top surface. In an exemplary embodiment of the present disclosure, the via plug 88 of FIG. 2I may be omitted. Other, non-described elements may be understood with reference to FIGS. 2A-2F.

Similar to the three-dimensional memory device 100A described above, since the upper portions of the string selection line gate electrode 50 and the pad pattern 70 are formed of metal silicide to have a resistance lower than that of poly-crystalline silicon (p-Si), and to prevent electrical bridging between adjacent components, the three-dimensional memory devices 100B-100I described above may provide high performance and maintain reliability.

FIGS. 3 to 25 are diagrams illustrating a method of manufacturing a three-dimensional memory device according to an exemplary embodiment of the present disclosure. FIGS. 6 to 21 are enlarged views of region A of FIG. 5.

Figure 3:
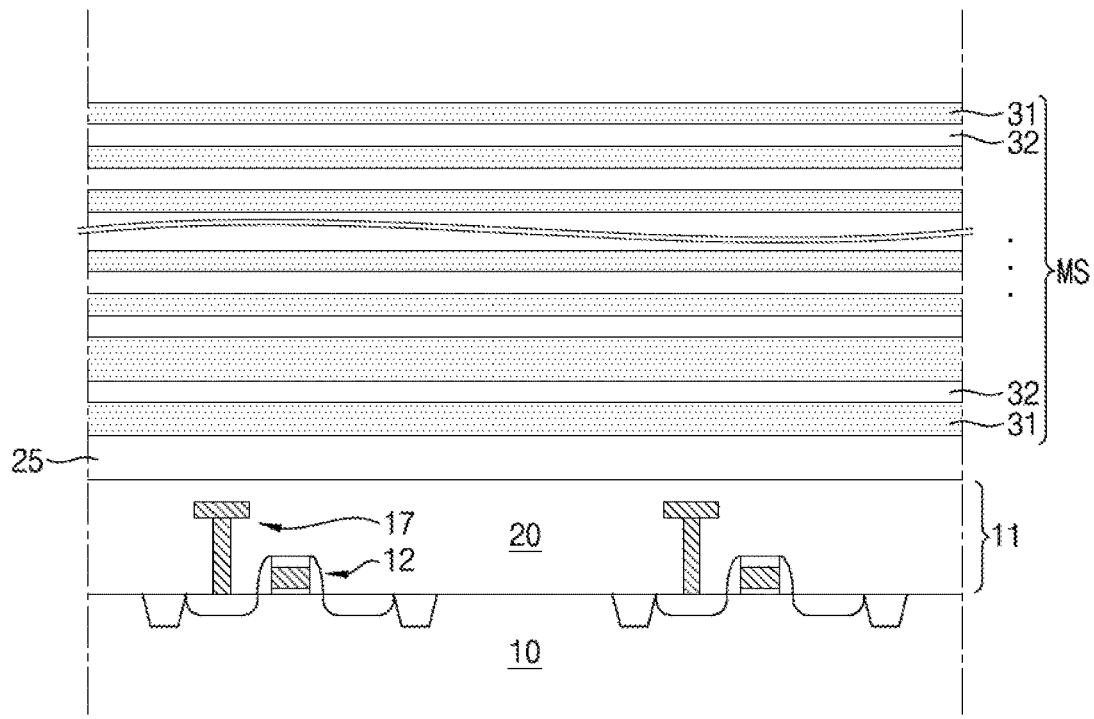

Referring to FIG. 3, a method of manufacturing a three-dimensional memory device according to an exemplary embodiment of the present disclosure may include forming a logic circuit layer 11 on a substrate 10, forming a common source layer 25 on the logic circuit layer 11, and forming a mold stack MS on the common source layer 25.

The substrate 10 may include a silicon (Si) wafer. In an exemplary embodiment of the present disclosure, the substrate 10 may include, for example, an epitaxial layer, a silicon-on-insulator (SOI) layer, or other semiconducting material layer.

The forming of the logic circuit layer 11 may include forming a transistor 12 and a metal interconnection 17 on the substrate 10, and forming a lower insulating layer 20 covering the transistor 12 and the metal interconnection 17. The lower insulating layer 20 may include at least one of silicon oxide ($SiO_2$), silicon nitride ($Si_3N_4$), or a combination thereof.

The forming of the common source layer 25 may include performing a deposition process to form N-doped poly-crystalline silicon (p-Si) containing N-type impurities such as, for example, phosphorus (P) or arsenic (As).

The forming of the mold stack MS may include alternately stacking a plurality of mold layers 31 and a plurality of sacrificial layers 32 by performing deposition processes. The mold layers 31 may include an insulator such as silicon oxide ($SiO_2$). The sacrificial layers 32 may include a material having an etch selectivity with respect to that of the common source layer 25 and the mold layers 31. For example, the sacrificial layers 32 may include one of, for example, silicon nitride ($Si_3N_4$), silicon oxynitride (SiON), silicon carbide (SiC), silicon germanium (SiGe), or other insulators.

Figure 4:
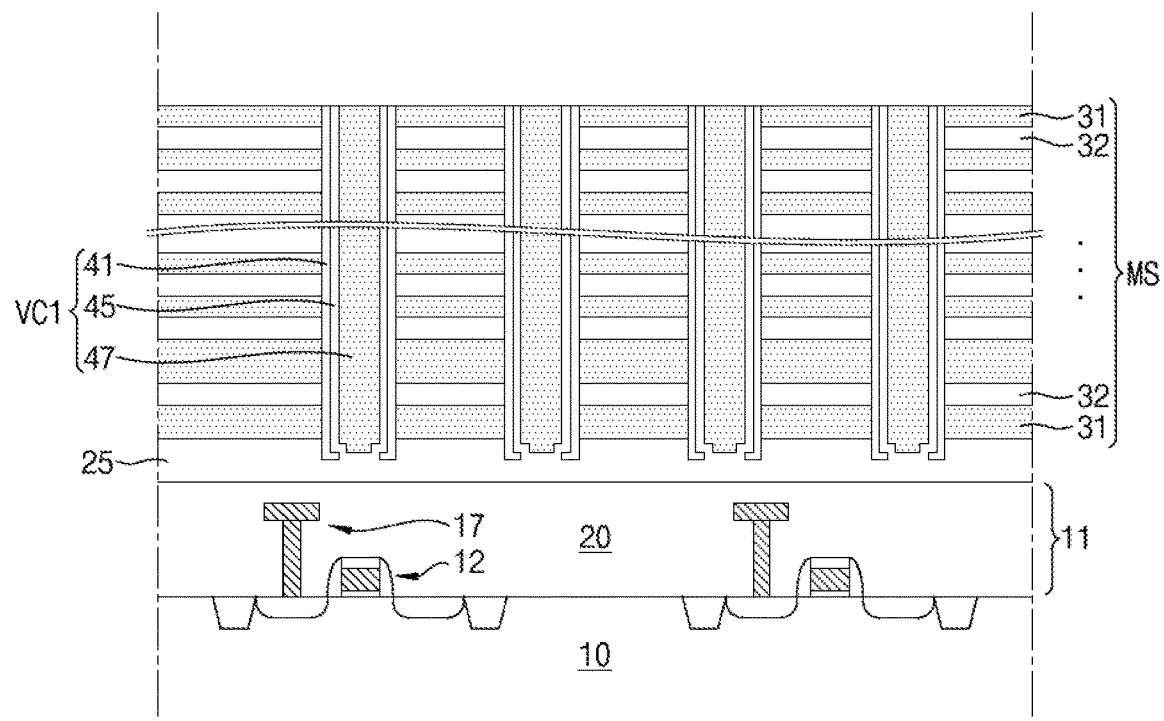

Referring to FIG. 4, the method may include forming a lower vertical channel structure VC1 vertically penetrating the mold stack MS to be connected to the common source layer 25. The forming of the lower vertical channel structure VC1 may include forming a lower vertical channel hole that vertically penetrates the mold stack MS to expose the common source layer 25, and forming a memory layer 41, a lower channel layer 45, and a lower gap-fill pattern 47 in the lower vertical channel hole.

The forming of the memory layer 41 may include conformally forming a memory material layer on an inner surface and a bottom surface of the lower vertical channel hole to a predetermined thickness, and performing an etch-back process to partially remove the memory material layer on a bottom surface of the lower vertical channel hole. The memory layer 41 may be formed on the bottom surface and sidewalls of the lower vertical channel hole to have a shape, of which a central lower surface is opened. For example, the central portion of the memory layer 41 on the bottom surface of the lower vertical channel hole may be removed.

The forming of the lower channel layer 45 may include conformally forming a channel material layer on an inner surface of the memory layer 41 to a predetermined thickness not to completely fill the lower vertical channel hole, and performing an etch-back process to partially remove the channel material layer on the bottom surface of the lower vertical channel hole. The lower channel layer 45 may include an intrinsic semiconducting material. For example, the lower channel layer 45 may include undoped poly-crystalline silicon (p-Si). The lower channel layer 45 may be in direct contact with the common source layer 25.

The forming of the lower gap-fill pattern 47 may include forming a lower gap-fill insulator on the inner surface of the lower channel layer 45 to sufficiently fill remaining portion of the lower vertical channel hole, and performing a planarization process such as chemical mechanical polishing (CMP). For example, the lower gap-fill pattern 47 may include silicon oxide ($SiO_2$). The upper surface of the mold stack MS and the upper surface of the lower vertical channel structure VC1 may be coplanar.

Figure 5:
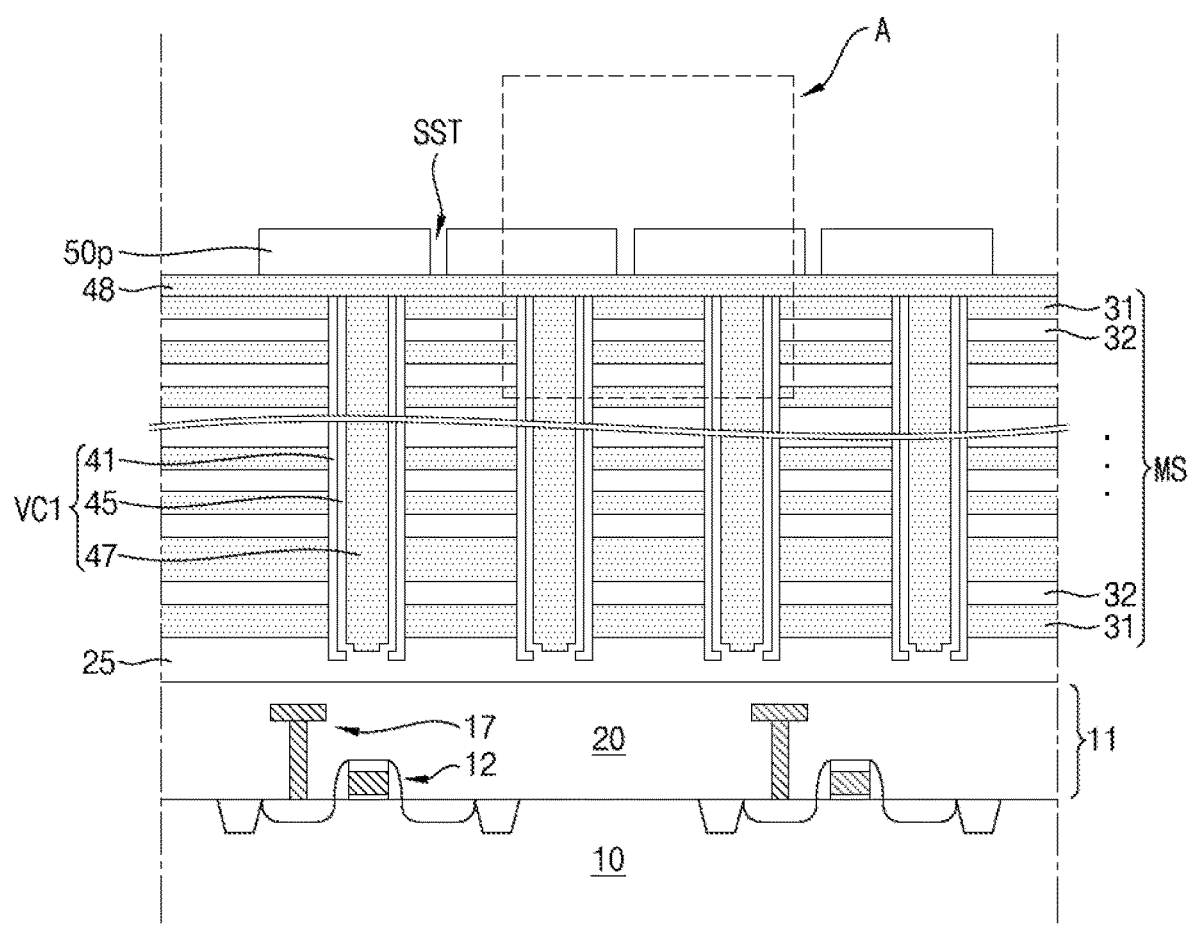

Referring to FIG. 5, the method may include forming a lower buffer insulating layer 48 on the mold stack MS and the lower vertical channel structure VC1, and forming a preliminary string selection line gate electrode 50*p* on the lower buffer insulating layer 48.

The forming of the lower buffer insulating layer 48 may include entirely forming a silicon oxide ($SiO_2$) layer to completely cover the mold stack MS and the lower vertical channel structure VC1 by performing a deposition process. The forming of the preliminary string selection line gate electrode 50*p* may include forming a string selection line gate material layer on the lower buffer insulating layer 48, and forming a string selection line separation trench SST to separate a string selection line gate material layer. The string selection line separation trench SST may be arranged between the lower vertical channel structures VC1 to have a wave shape or a zigzag shape in a plan view with reference to FIG. 1.

Figure 6:
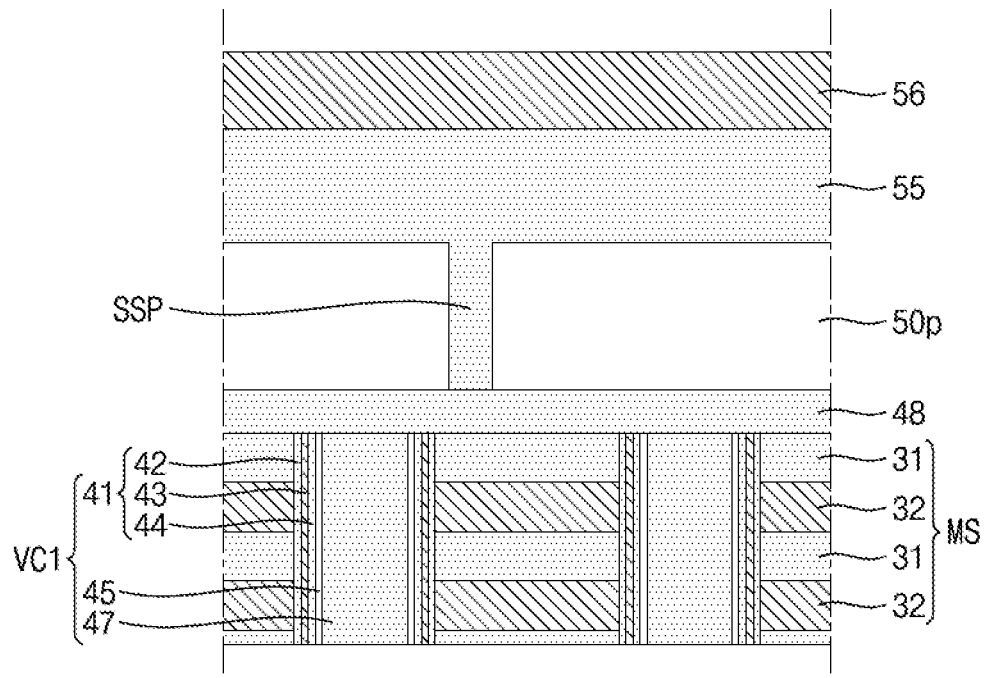

Referring to FIG. 6, the method may include forming a sacrificial buffer insulating layer 55 on the preliminary string selection line gate electrode 50*p*, and forming a mask pattern 56 on the sacrificial buffer insulating layer 55. The sacrificial buffer insulating layer 55 may include silicon oxide ($SiO_2$), and the mask pattern 56 may include silicon nitride ($Si_3N_4$) to have an etch selectivity with respect to silicon oxide ($SiO_2$) of the sacrificial buffer insulating layer 55. The sacrificial buffer insulating layer 55 filled in the string selection line separation trench SST may be formed as a string selection line separation pattern SSP.

The memory layer 41 may include a blocking barrier layer 42, a charge trap layer 43, and a tunnel insulating layer 44. For example, the blocking barrier layer 42 and the tunnel insulating layer 44 may include silicon oxide (SiO$_2$), and the charge trap layer 43 may include silicon nitride (Si$_3$N$_4$) or a high dielectric metal oxide. For example, the blocking barrier layer 42, the charge trap layer 43, and the tunnel insulating layer 44 may be sequentially formed on the inner side surface of the lower vertical channel hole, and on a portion of the bottom surface of the lower vertical channel hole in the recessed portion of the common source layer 25.

Figure 7:
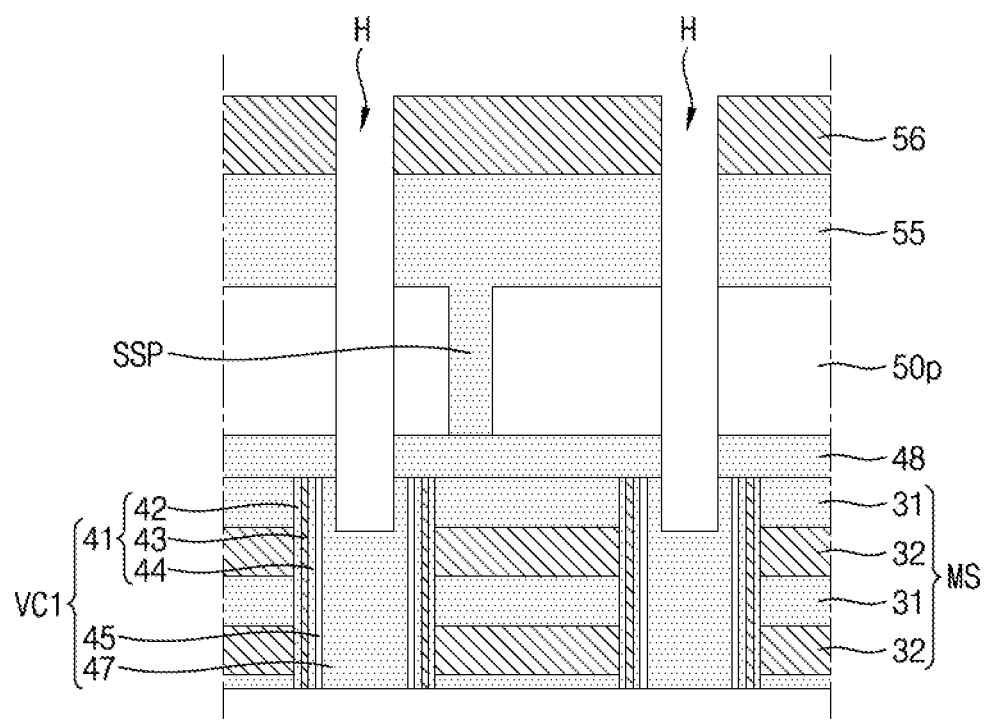

Referring to FIG. 7, the method may include forming an upper vertical channel hole H that is vertically aligned with the lower vertical channel structure VC1. For example, the upper vertical channel hole H and the lower vertical channel structure VC1 may overlap and be arranged concentrically. A lower end of the upper vertical channel hole H may partially recess an upper portion of the lower gap-fill pattern 47, and may accordingly expose the lower gap-fill pattern 47 of the lower vertical channel structure VC1.

Figure 8:
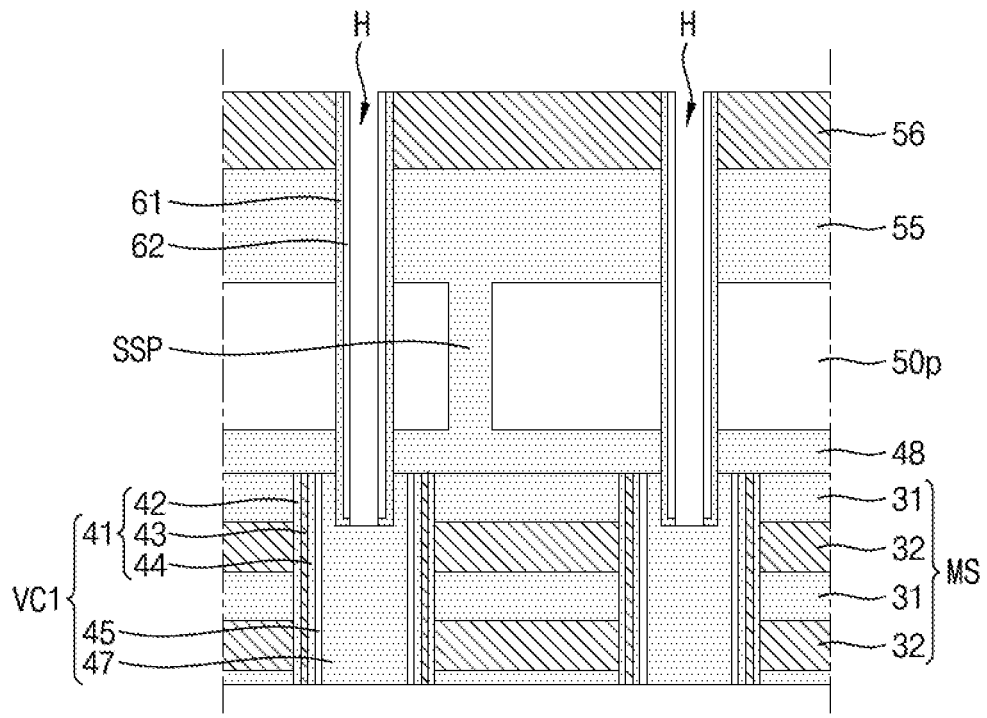

Referring to FIG. 8, the method may include forming an insulating liner 61 and a sacrificial liner 62 on an inner surface of the upper vertical channel hole H. The insulating liner 61 and the sacrificial liner 62 may be conformally formed to have thicknesses that do not completely fill the upper vertical channel hole H by performing a deposition process. An etch-back process may be performed to partially remove the insulating liner 61 and the sacrificial liner 62 on the bottom surface of the upper vertical channel hole H. The insulating liner 61 and the sacrificial liner 62 may have a cylinder shape or a straw shape. For example, in a plan view, the upper vertical channel hole H may have a circular shape, and the insulating liner 61 and the sacrificial liner 62 may each have a disk shape. The insulating liner 61 may include silicon oxide (SiO$_2$), and the sacrificial liner 62 may include poly-crystalline silicon (p-Si). Thus, the sacrificial liner 62 may have an etching selectivity with respect to the insulating liner 61. The insulating liner 61 and the sacrificial liner 62 may extend into the lower vertical channel structure VC1 along sidewalls of the upper vertical channel hole H. The bottom end of the sacrificial liner 62 may not be in contact with the lower gap-fill pattern 47. For example, a portion of the insulating liner 61 may be formed between the lower end of the sacrificial liner 62 and the lower gap-fill pattern 47. The insulating liner 61, the sacrificial buffer insulating layer 55, the lower buffer insulating layer 48, and the lower gap-fill pattern 47 may include the same material. For example, an interface between the insulating liner 61 and the sacrificial buffer insulating layer 55, an interface between the insulating liner 61 and the lower buffer insulating layer 48, and an interface between the insulating liner 61 and the lower gap-fill pattern 47 may disappear. For example, in this case, no clear interface can be observed between any two adjacent ones in contact with each other among the insulating liner 61, the sacrificial buffer insulating layer 55, the lower buffer insulating layer 48, and the lower gap-fill pattern 47.

Figure 9:
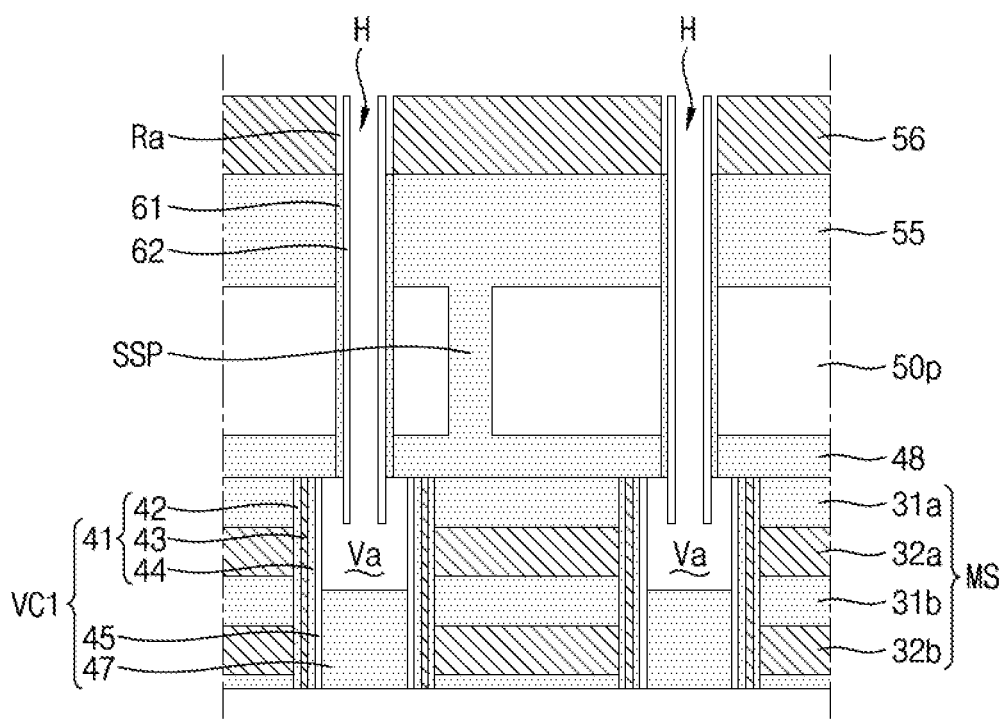

Referring to FIG. 9, the method may include performing a wet etch process to recess an upper portion of the insulating liner 61 and to remove an upper portion of the lower gap-fill pattern 47 of the lower vertical channel structure VC1. The insulating liner 61 and the lower gap-fill pattern 47 may be formed of the same material, and thus may be removed by the same wet etch process. During the process, a lower portion of the insulating liner 61 may also be removed. Thus, a ring-shaped recess Ra surrounding an upper portion of the sacrificial liner 62 may be formed between the sacrificial liner 62 and the mask pattern 56, and a vacancy Va may be formed at an upper portion of the lower vertical channel structure VC1. The upper and lower portions of the sacrificial liner 62 may protrude upward and downward, respectively, by removing the insulating liner 61 on the sidewalls thereof. The lower surface of the vacancy Va may be located at a middle level of a second uppermost mold layer 31b between an uppermost sacrificial layer 32a and a second uppermost sacrificial layer 32b. The upper surface of the vacancy Va may be located at a level the same as that of the upper surface of an uppermost mold layer 31a. The vacancy Va may also expose the lower channel layer 45 of the lower vertical channel structure VC1.

Figure 10:
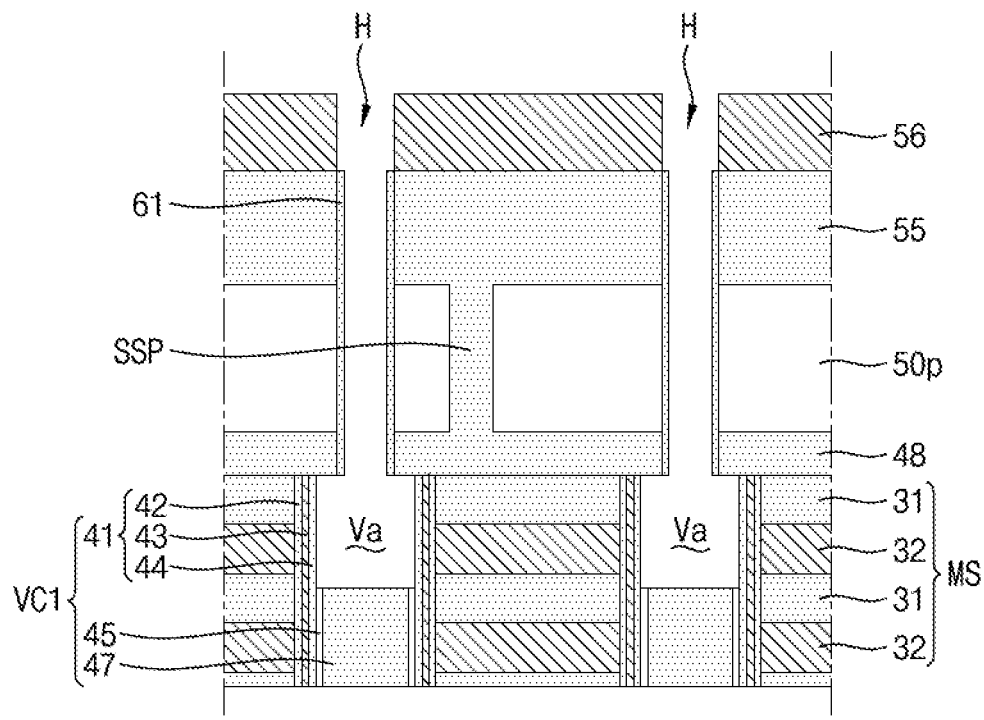

Referring to FIG. 10, the method may include performing a wet etch process to remove the sacrificial liner 62 in the upper vertical channel hole H and the lower channel layer 45 exposed in the vacancy Va. The sacrificial liner 62 and the lower channel layer 45 may be formed of the same material, and thus may be removed by the same wet etch process. The tunnel insulating layer 44 of the memory layer 41 may be exposed on sidewalls of the vacancy Va. Top ends of the lower channel layer 45 and an upper surface of the lower gap-fill pattern 47 may be exposed on a lower surface of the vacancy Va. For example, the insulating liner 61 may remain only on an inner surface of the upper vertical channel hole H.

Figure 11:
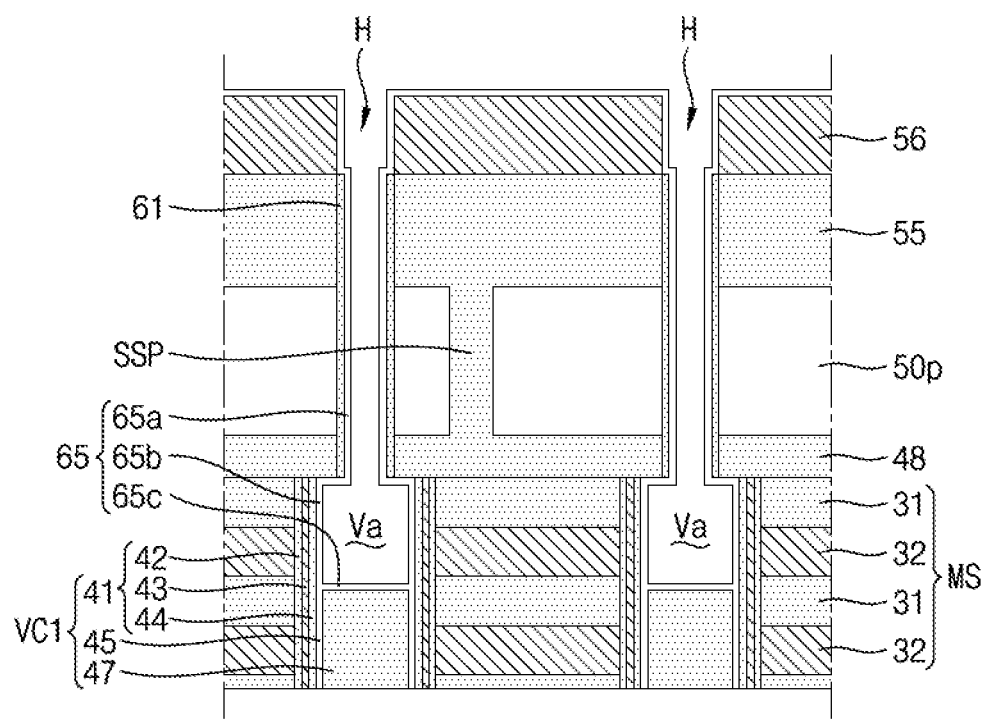

Referring to FIG. 11, the method may include conformally forming an upper channel layer 65 in the upper vertical channel hole H and the vacancy Va. The upper channel layer 65 may include undoped poly-crystalline silicon (p-Si). For example, the upper channel layer 65 and the lower channel layer 45 may be formed of the same material. The upper channel layer 65 may include a first upper channel layer 65a formed on the insulating liner 61 in the upper vertical channel hole H, a second upper channel layer 65b formed on the sidewall of the tunnel insulating layer 44 exposed in the vacancy Va, and a third upper channel layer 65c formed on the upper surface of the lower gap-fill pattern 47. For example, in the vacancy Va, the upper channel layer 65 may be formed on the exposed surface of the tunnel insulating layer 44, the exposed upper surface of the lower gap-fill pattern 47, the exposed upper portions of the lower channel layer 45, the exposed lower surface of the lower buffer insulating layer 48, and the exposed lower portion of the insulating liner 61. The upper channel layer 65 may be formed on the top end of the insulating liner 61 and the exposed sidewall and the exposed upper surface of the mask pattern 56. Accordingly, the lower channel layer 45 and the upper channel layer 65 may be electrically and physically connected to each other.

Figure 12:
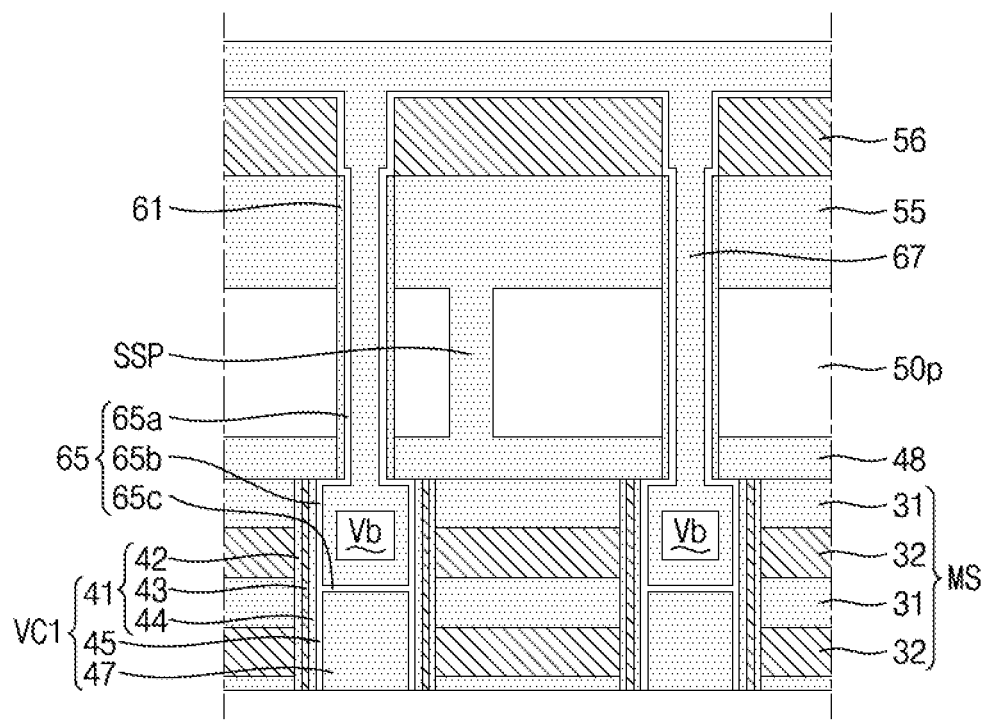

Referring to FIG. 12, the method may include forming an upper gap-fill pattern 67 in the vacancy Va and the upper vertical channel hole H. The upper gap-fill pattern 67 may fill the vacancy Va to cover the surface of the upper channel layer 65 in the vacancy Va. A lower portion of the upper gap-fill pattern 67 formed in the vacancy Va may have a width wider than that of an upper portion of the upper gap-fill pattern 67 formed in the upper vertical channel hole H. In an exemplary embodiment of the present disclosure, a void Vb may be formed in the vacancy Va. For example, the void Vb may be formed in the lower portion of the upper gap-fill pattern 67. The upper gap-fill pattern 67 may include silicon oxide (SiO$_2$).

Figure 13:
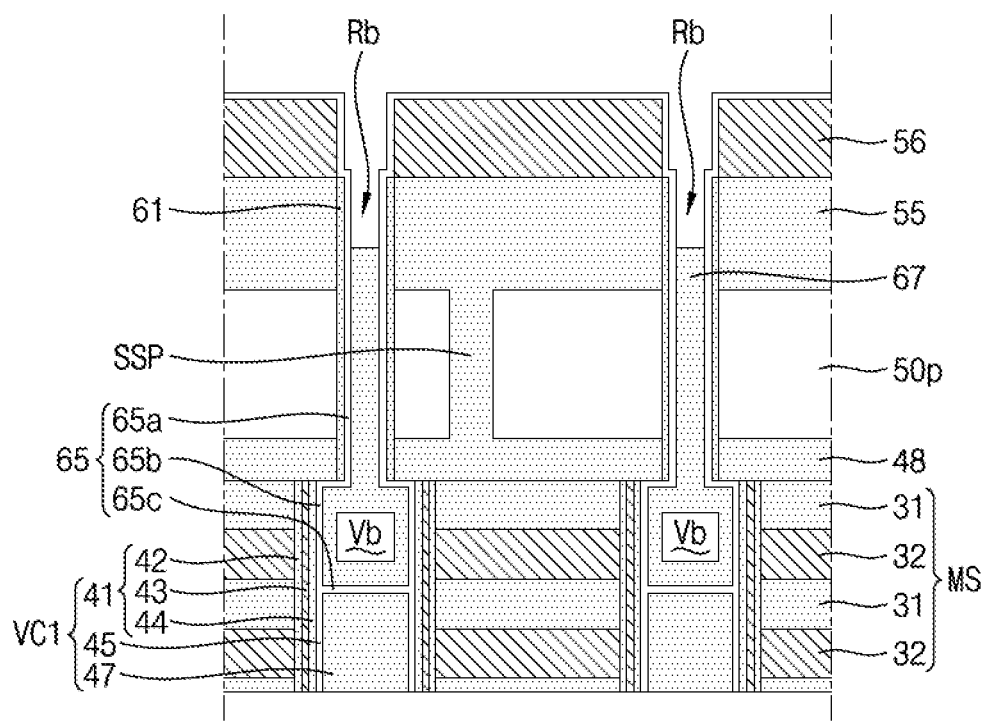

Referring to FIG. 13, the method may include performing an etch-back process to partially remove an upper portion of the upper gap-fill pattern 67 to form a recess Rb in the upper vertical channel hole H. The lower surface of the recess Rb may be positioned at a middle level of the sacrificial buffer insulating layer 55. The upper channel layer 65 may be exposed on a sidewall of the recess Rb.

Figure 14:
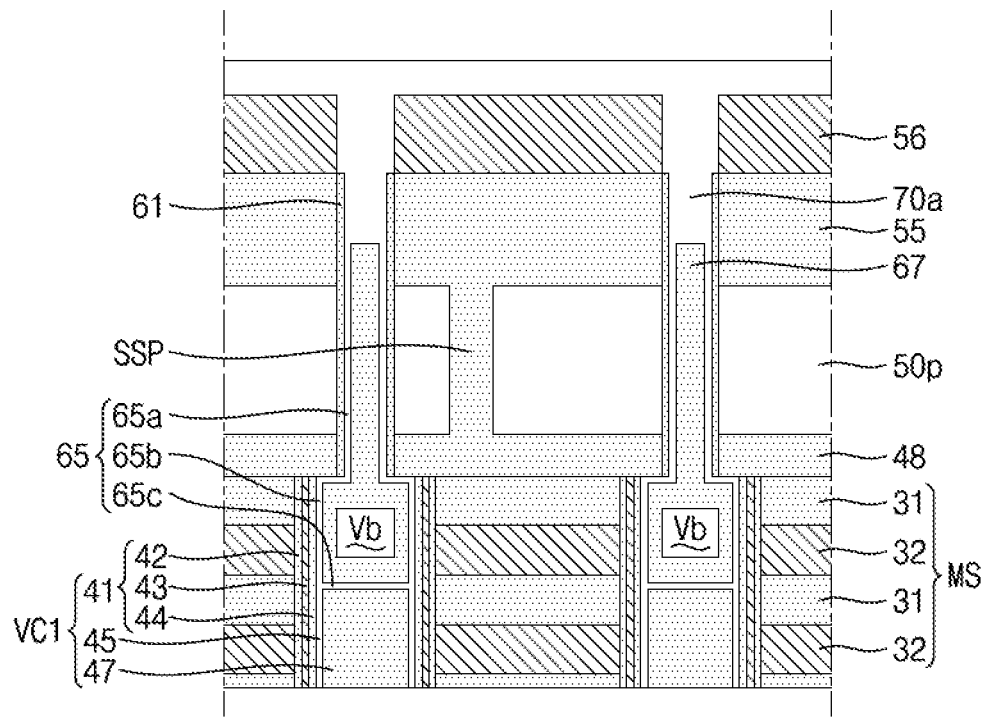

Referring to FIG. 14, the method may include forming a pad material layer 70a in the recess Rb by performing a deposition process. The pad material layer 70a may include N-doped poly-crystalline silicon (p-Si). Since the pad material layer 70a and the upper channel layer 65 are contacted and connected with each other, the N-type impurities in the pad material layer 70a may out-diffuse into the upper channel layer 65 which may include undoped poly-crystalline silicon (p-Si). The diffusion distance of the N-type impurities may be located at a level higher than a middle level of the preliminary string selection line gate electrode 50p. For example, the preliminary string selection line gate electrode 50p and the upper channel layer 65 including diffused N-type impurities may horizontally overlap each other.

Figure 15:
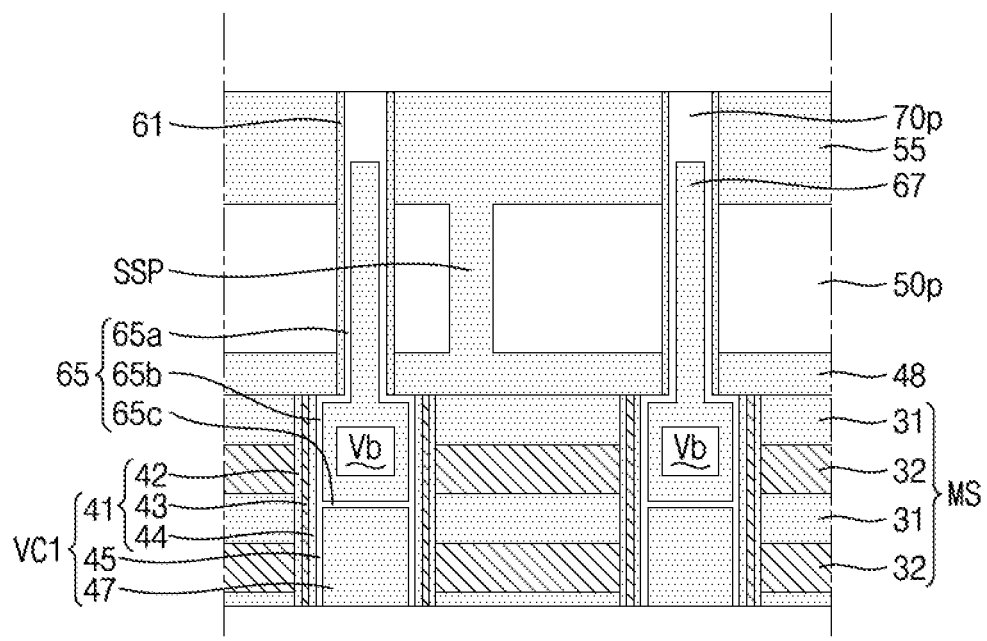

Referring to FIG. 15, the method may include forming a preliminary pad pattern 70p by performing a planarization process such as CMP. During the CMP process, the mask pattern 56, the materials on the top surface of the mask pattern 56, and the materials in the upper portion of the upper vertical channel hole H may be removed. The upper surface of the preliminary pad pattern 70p, the top end of the insulating liner 61, and the upper surface of the sacrificial buffer insulating layer 55 may be coplanar.

Figure 16:
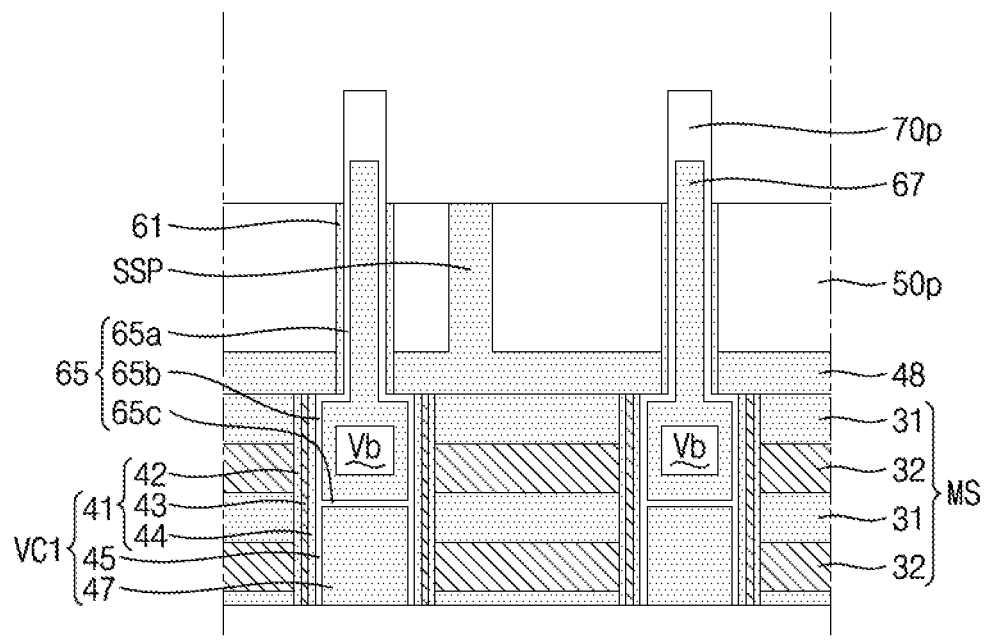

Referring to FIG. 16, the method may include removing the sacrificial buffer insulating layer 55, for example, by performing an etch-back process. After removing the sacrificial buffer insulating layer 55, the surface of the preliminary pad pattern 70p, the upper sidewall of the upper channel layer 65, the top end of the insulating liner 61, the upper surface of the preliminary string selection line gate electrode 50p, and the upper surface of the string selection line separation pattern SSP may be exposed.

Figure 17:
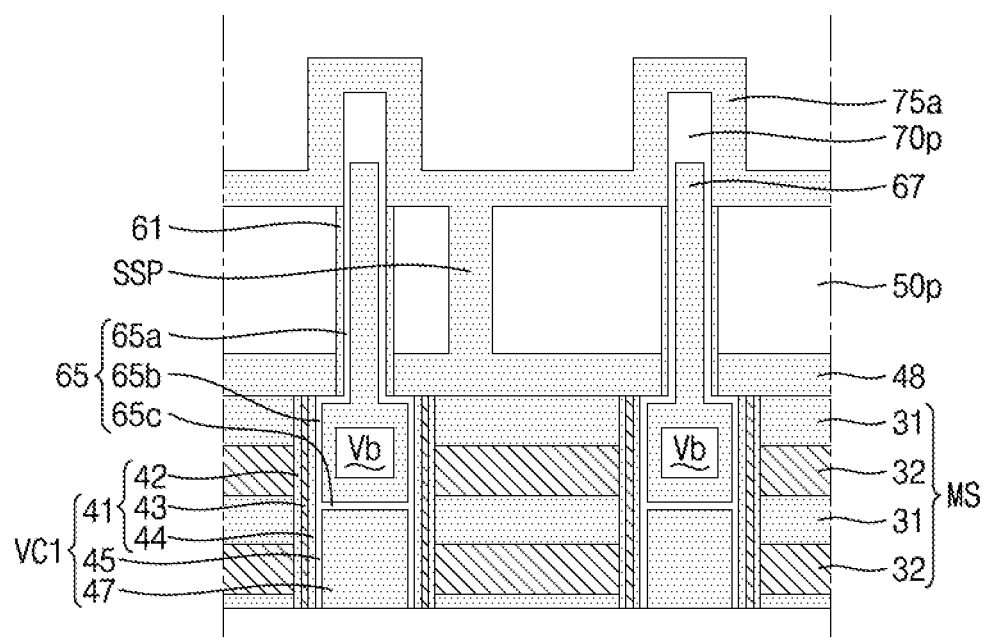

Referring to FIG. 17, the method may include entirely forming a spacer material layer 75a by performing a deposition process. For example, the spacer material layer 75a may be conformally formed on the entire exposed surfaces, for example, the surface of the preliminary pad pattern 70p, the upper sidewall of the upper channel layer 65, the top end of the insulating liner 61, the upper surface of the preliminary string selection line gate electrode 50p, and the upper surface of the string selection line separation pattern SSP. The spacer material layer 75a may include silicon oxide ($SiO_2$).

Figure 18:
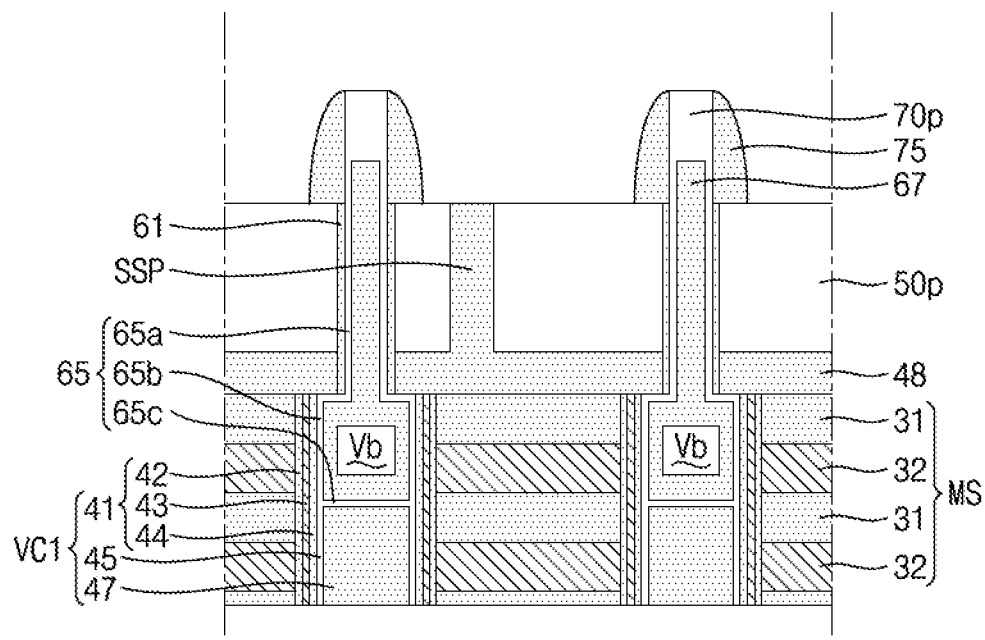

Referring to FIG. 18, the method may include forming a pad spacer 75 by performing an etch-back process. The pad spacer 75 may be formed to surround the sidewall of the preliminary pad pattern 70p and the sidewall of the upper channel layer 65, and formed on a portion of the upper surface of the preliminary string selection line gate electrode 50p adjacent to the insulating liner 61.

Figure 19:
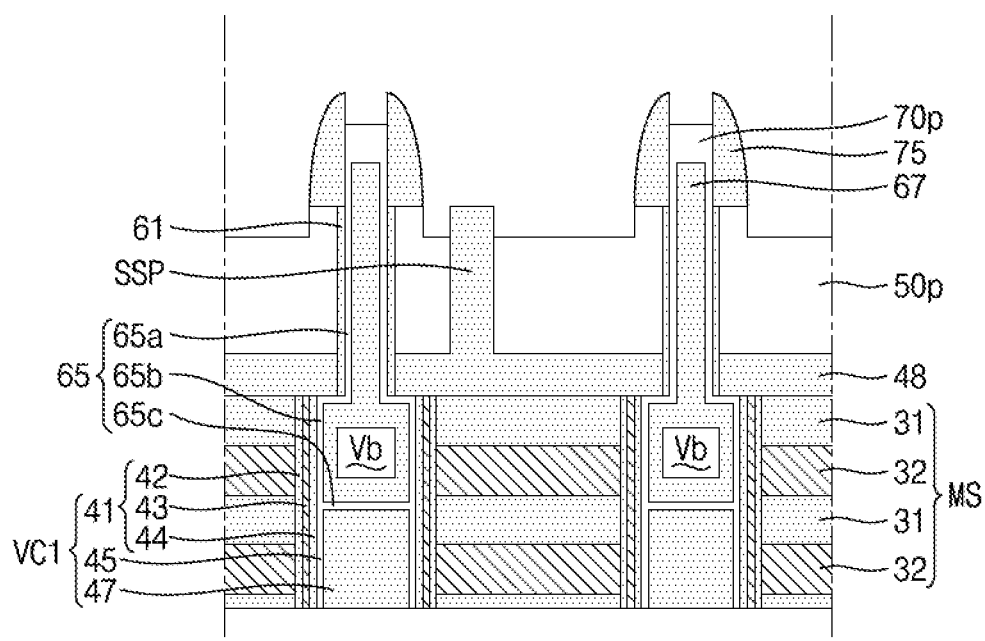

Referring to FIG. 19, the method may include recessing the upper surfaces of the preliminary pad pattern 70p and the preliminary string selection line gate electrode 50p by performing an etching process using the pad spacer 75 as an etching mask. For example, the top surface of the preliminary string selection line gate electrode 50p may be partially recessed, such that the preliminary string selection line gate electrode 50p may include a protruding portion and a recessed portion. The upper portion of the string selection line separation pattern SSP may protrude upward from the upper surface of the recessed preliminary string selection line gate electrode 50p.

Figure 20:
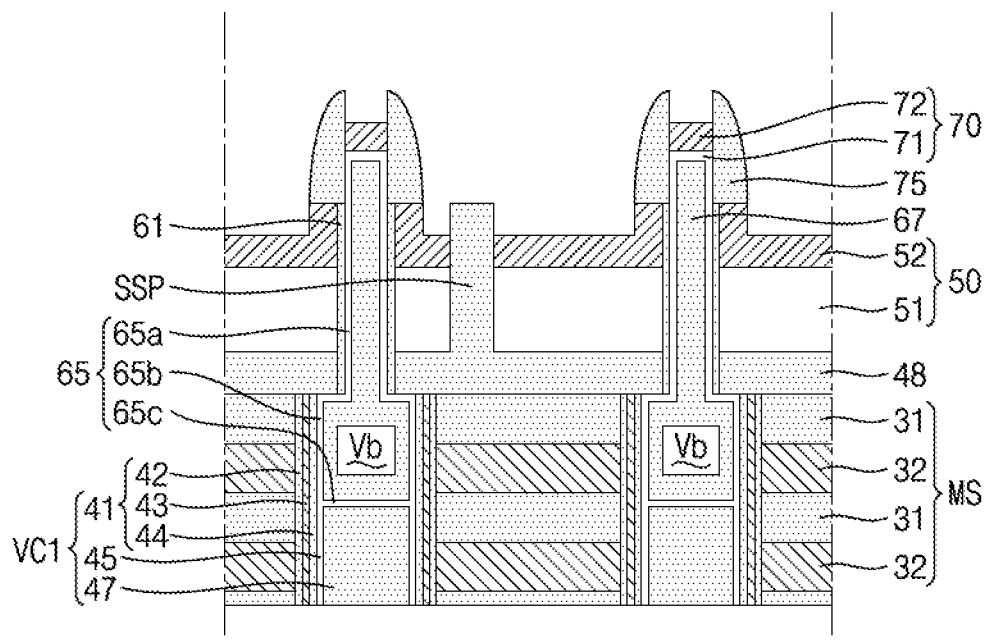
Figure 21:
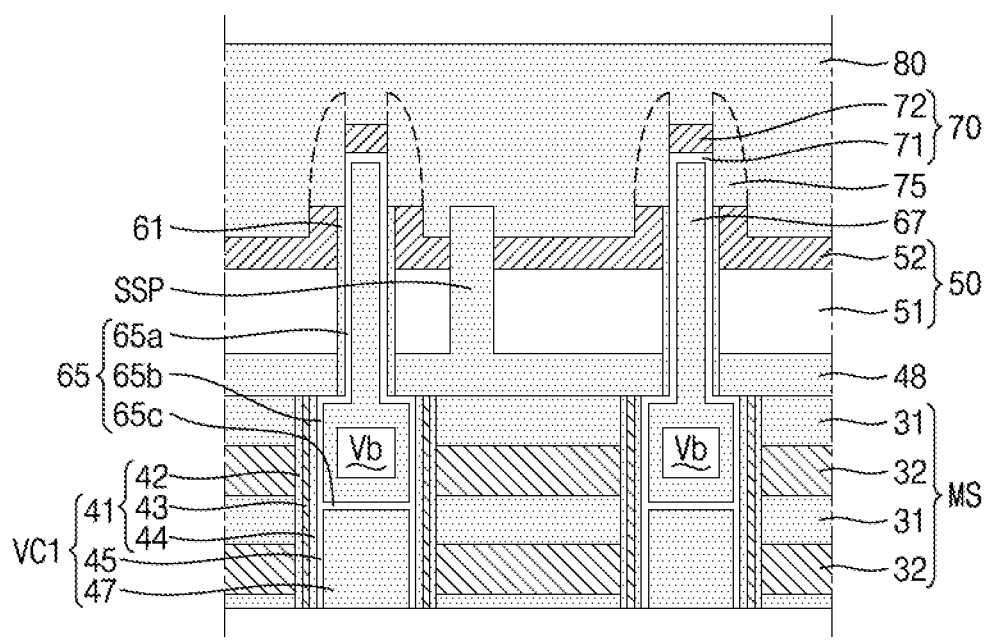

Referring to FIG. 20, the method may include forming a pad pattern 70 and a string selection line gate electrode 50 by performing a silicidation process. The pad pattern 70 including the lower pad pattern 71 and the upper pad pattern 72 may be formed by partially siliciding the upper portion of the preliminary pad pattern 70p, and the string selection line gate electrode 50 including the lower string selection line gate electrode 51 and the upper string selection line gate electrode 52 may be formed by partially siliciding the exposed upper portion of the preliminary string selection line gate electrode 50p. Since the upper string selection line gate electrode 52 is formed in the upper portion of the preliminary string selection line gate electrode 50p, the upper string selection line gate electrode 52 may include a protruding portion and a recessed portion. The protruding portion of the upper string selection line gate electrode 52 may surround a sidewall of the upper vertical channel structure VC2. The lower pad pattern 71 and the lower string selection line gate electrode 51 may include N-doped poly-crystalline silicon (p-Si), and the upper pad pattern 72 and the upper string selection line gate electrode 52 may include a metal silicide. For example, the upper pad pattern 72 and the upper string selection line gate electrode 52 may include at least one of, for example, nickel silicide (NiSi), titanium silicide (TiSi), cobalt silicide (CoSi), tungsten silicide (WSi) or other metal silicides. In an exemplary embodiment of the present disclosure, the upper pad pattern 72 and the upper string selection line gate electrode 52 may include nickel silicide (NiSi). The nickel silicide (NiSi) is formed by infiltration of nickel (Ni) atoms into silicon (Si), so that the volume of the poly-crystalline silicon (p-Si) pattern may not increase. Accordingly, structural instability and bridge phenomenon of the upper pad pattern 72 and the upper string selection line gate electrode 52 due to the expansion of the volume can be prevented. Also, since the upper surfaces of the preliminary pad pattern 70p and the preliminary string selection line gate electrode 50p are recessed and the silicidation processes are carried out on the upper portions of the preliminary pad pattern 70p and the preliminary string selection line gate electrode 50p, the volume expansion of the metal silicide may be confined to only allow upward expansion, and sideway expansion to narrow the spacing between adjacent elements, for example, the neighboring upper string selection line gate electrodes 52, to form a bridge may not occur.

Figure 21:
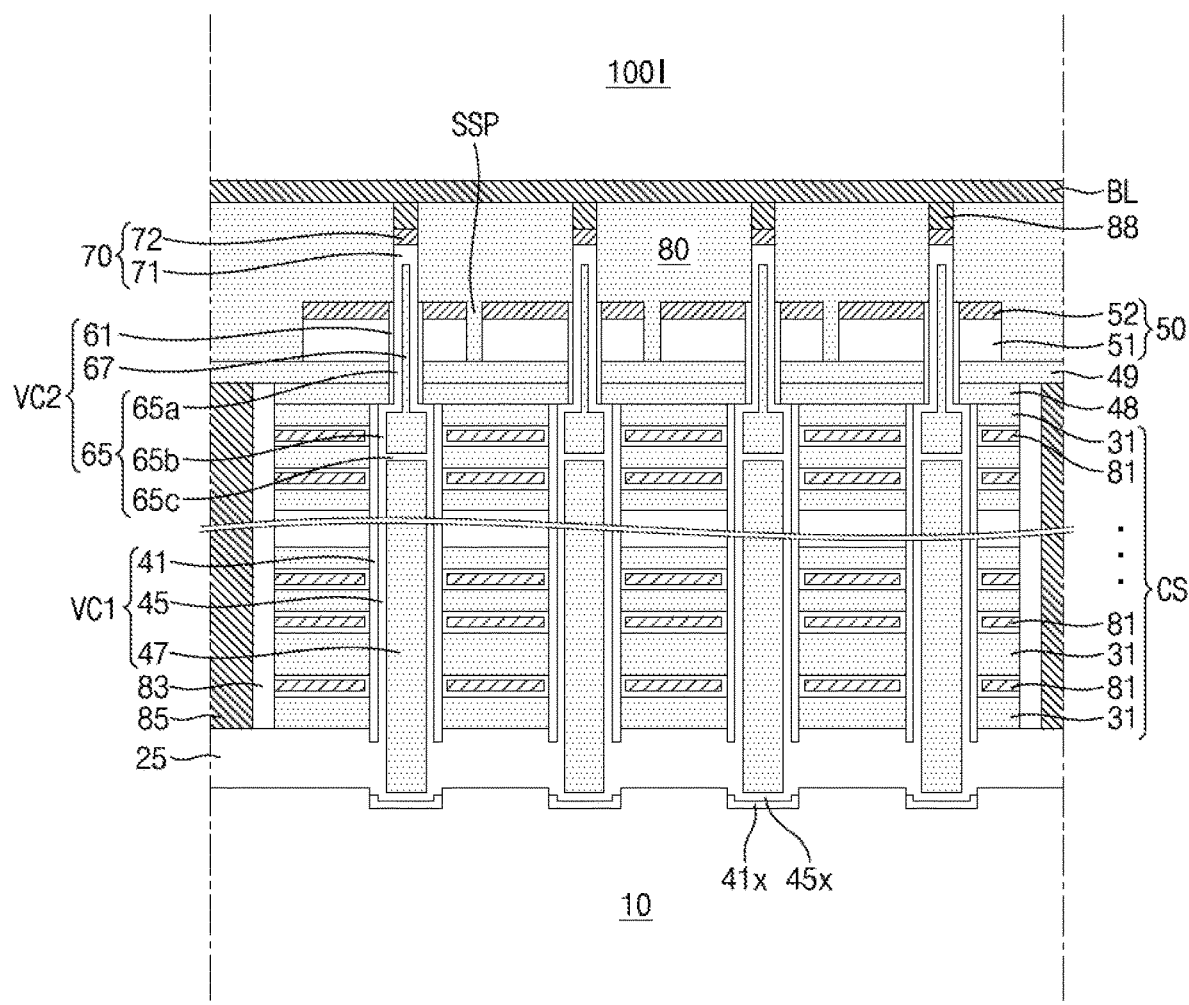
FIGS. 3 to 25 are diagrams illustrating a method of manufacturing a three-dimensional memory device according to an exemplary embodiment of the present disclosure.

Referring to FIG. 21, the method may include forming an upper insulating layer 80 by performing a deposition process. The upper insulating layer 80 and the pad spacer 75 may include the same material. Therefore, an interface between the upper insulating layer 80 and the pad spacer 75 may disappear. For example, there may be no interface between the upper insulating layer 80 and the pad spacer 75.

Figure 22:
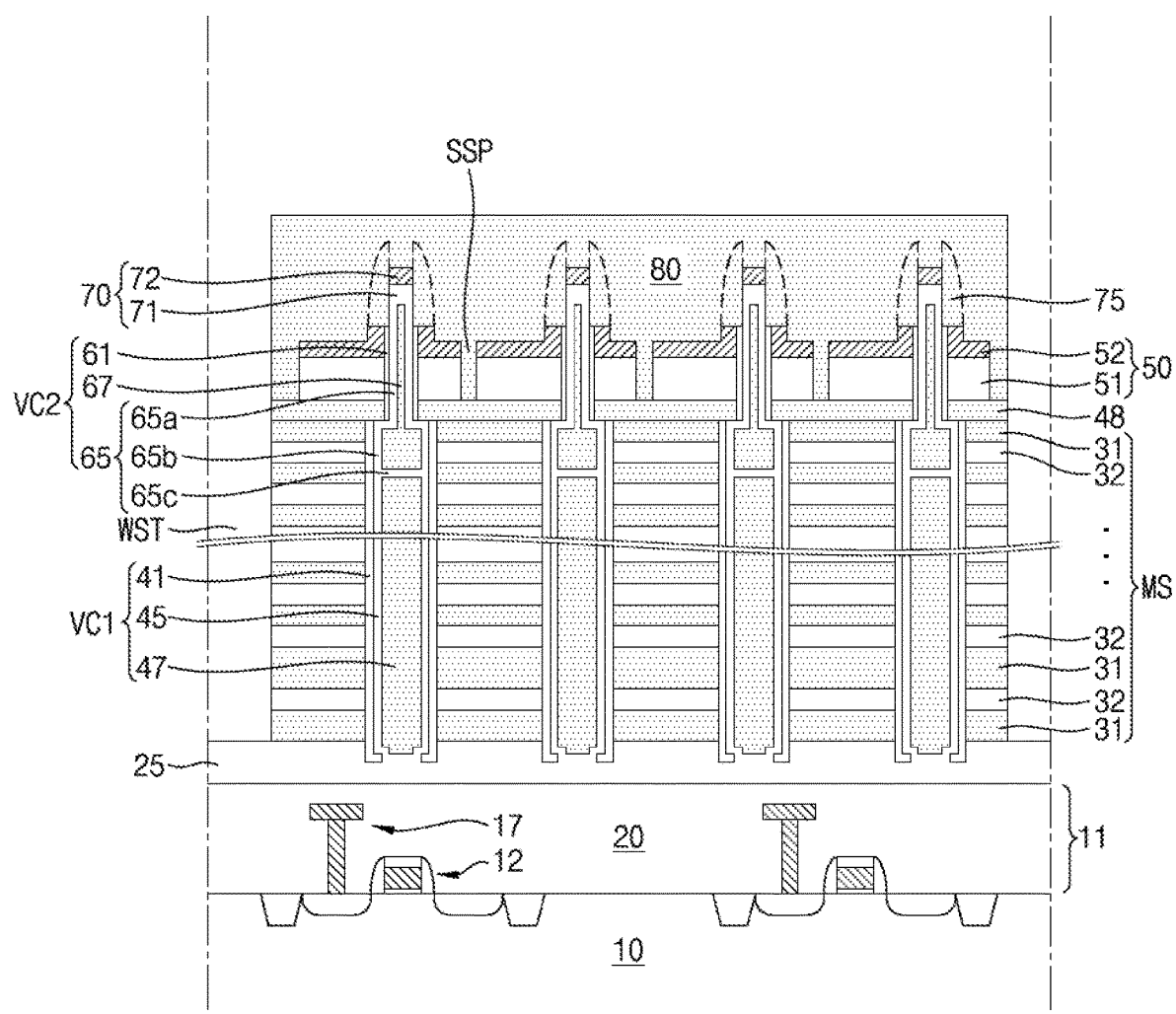

Referring to FIG. 22, the method may include forming a word line separation trench WST. In an exemplary embodiment of the present disclosure, the word line separation trench WST may be formed to extend in the column direction (see FIG. 1) between a plurality of vertical channel structures VC1 and VC2, and thus a plurality of word line separation trenches WST may be formed and spaced apart from each other in the row direction. For example, two word line separation trenches WST adjacent to each other may include four vertical channel structures VC1 and VC2 located therebetween in the row direction with reference to FIGS. 1 and 22. The forming of the word line separation trench WST may include performing an etch process to vertically penetrate the upper insulating layer 80, the lower buffer insulating layer 48, and the mold stack MS to expose the common source layer 25.

Figure 23:
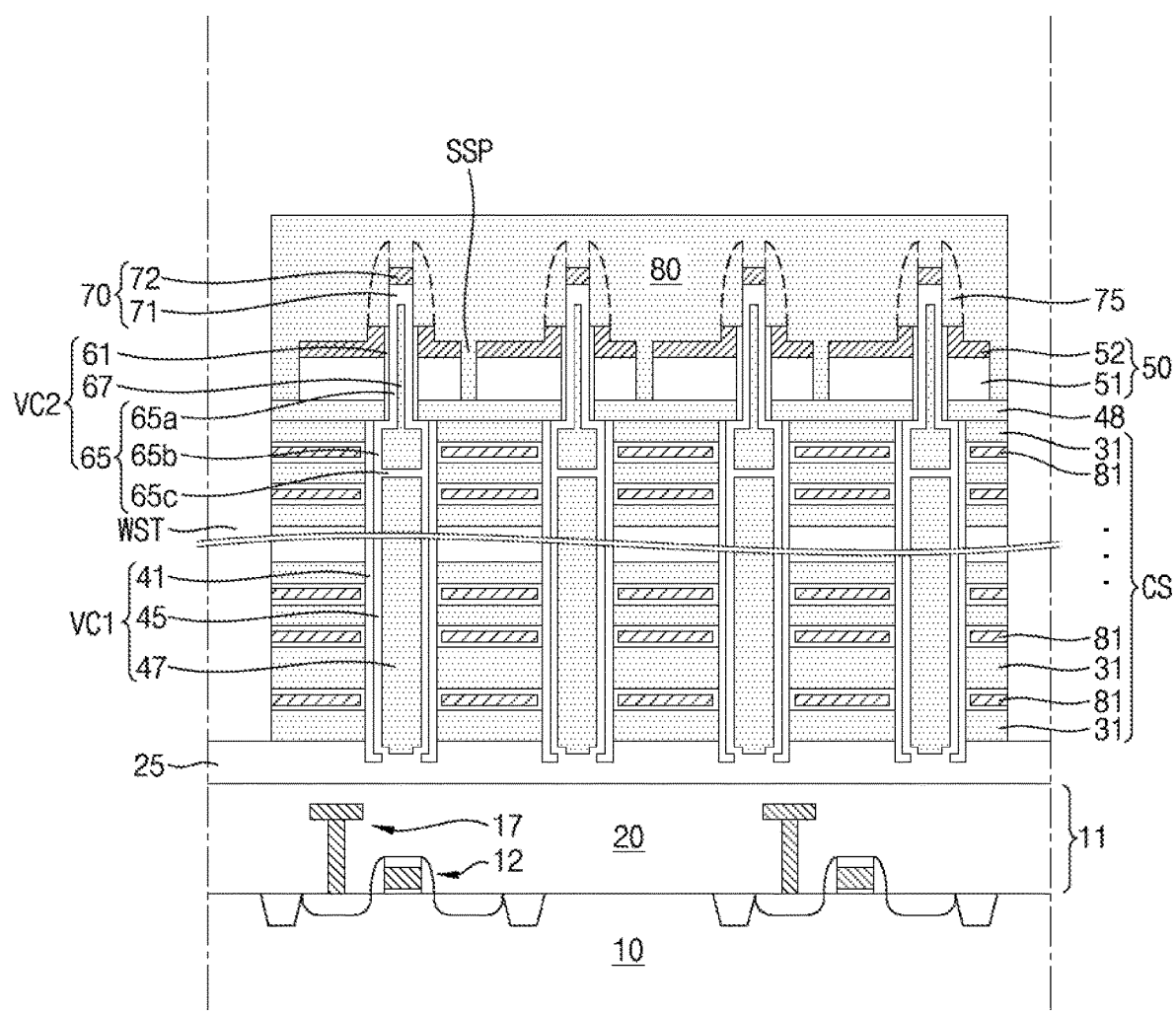

Referring to FIG. 23, the method may include removing the sacrificial layers 32 and forming word lines 81. The removing of the sacrificial layers 32 may include performing a wet etch process to remove the sacrificial layers 32 through the word line separation trench WST. The forming of the word lines 81 may include forming a barrier material layer and an electrode material layer in spaces in which the sacrificial layers 32 have been removed, and performing an etch-back process. The barrier material layer may include a blocking insulating layer such as, for example, aluminum oxide ($Al_2O_3$), hafnium oxide ($HfO_2$), etc., and a conductive barrier material such as, for example, titanium nitride (TiN), tantalum nitride (TaN), etc. The electrode material layer may include a metal such as, for example, tungsten (W), titanium (Ti), tantalum (Ta), platinum (Pt), etc.

Figure 24:
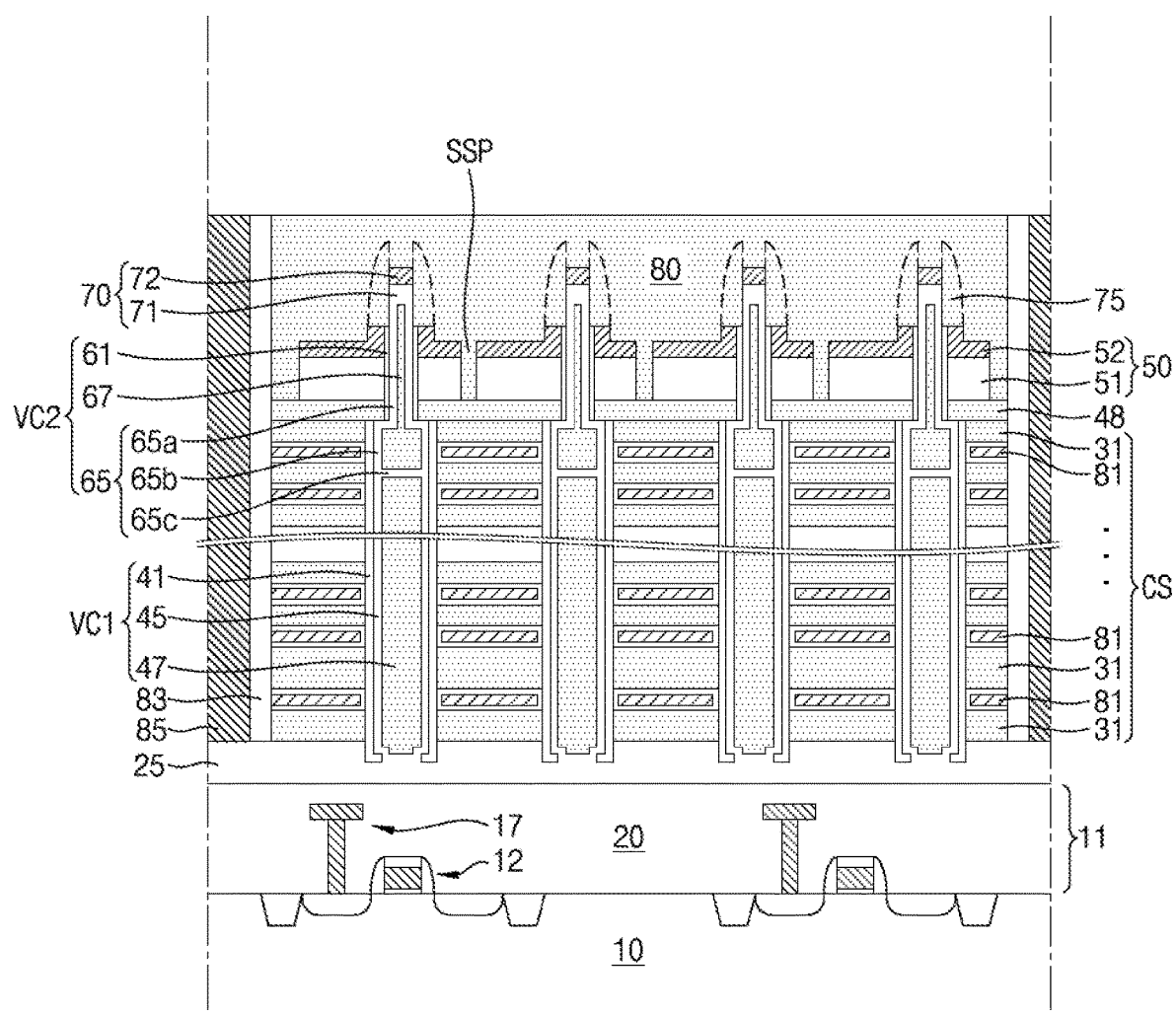

Referring to FIG. 24, the method may include forming a word line separation insulating layer 83 on an inner sidewall of the word line separation trench WST, and forming a common source plug 85 in the word line separation insulating layer 83. The common source plug 85 may have a dam shape. The method may further include planarizing top surfaces of the word line separation insulating layer 83, the common source plug 85, and the upper insulating layer 80 by performing a planarization process such as CMP. The common source plug 85 may be electrically connected to the common source layer 25, but electrically insulated from the word lines 81, because the sidewall of the common source plug 85 may be covered by the word line separation insulating layer 83.

Figure 25:
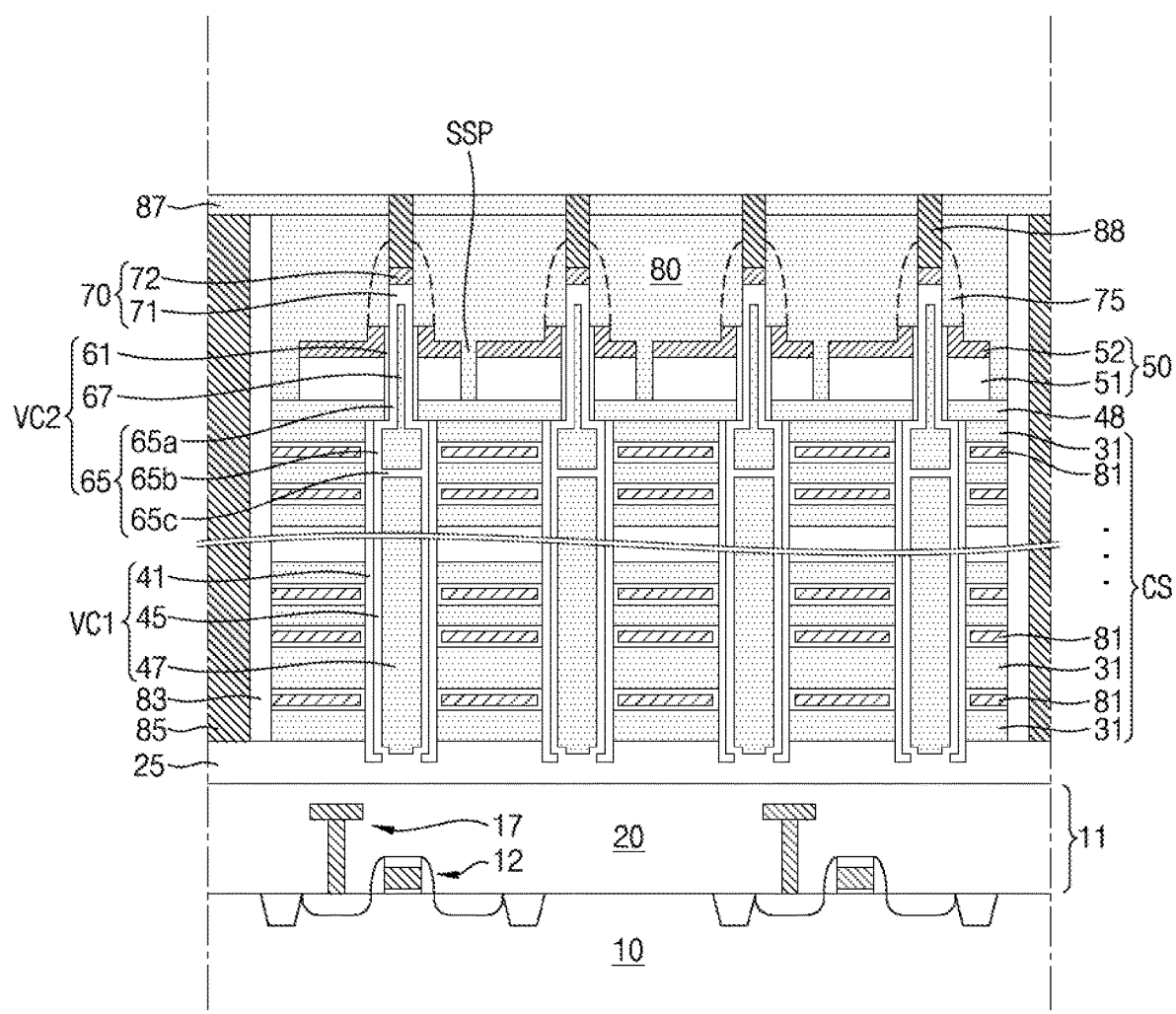

Referring to FIG. 25, the method may include forming a capping insulating layer 87 on the upper insulating layer 80, and forming a via plug 88. The capping insulating layer 87 may include at least one of, for example, silicon oxide ($SiO_2$), silicon nitride ($Si_3N_4$), silicon oxynitride (SiON), or other insulators. The forming of the via plug 88 may include forming a via hole vertically penetrates the capping insulating layer 87 and the upper insulating layer 80 to expose a top surface of the upper pad pattern 72, and filling an inside of the via hole with a conductive material. For example, the via plug 88 may include a metal such as tungsten (W).

Subsequently, referring to FIG. 2A, the method may include forming a bit line BL connected to the via plug 88 on the capping insulating layer 87.

Figure 26:
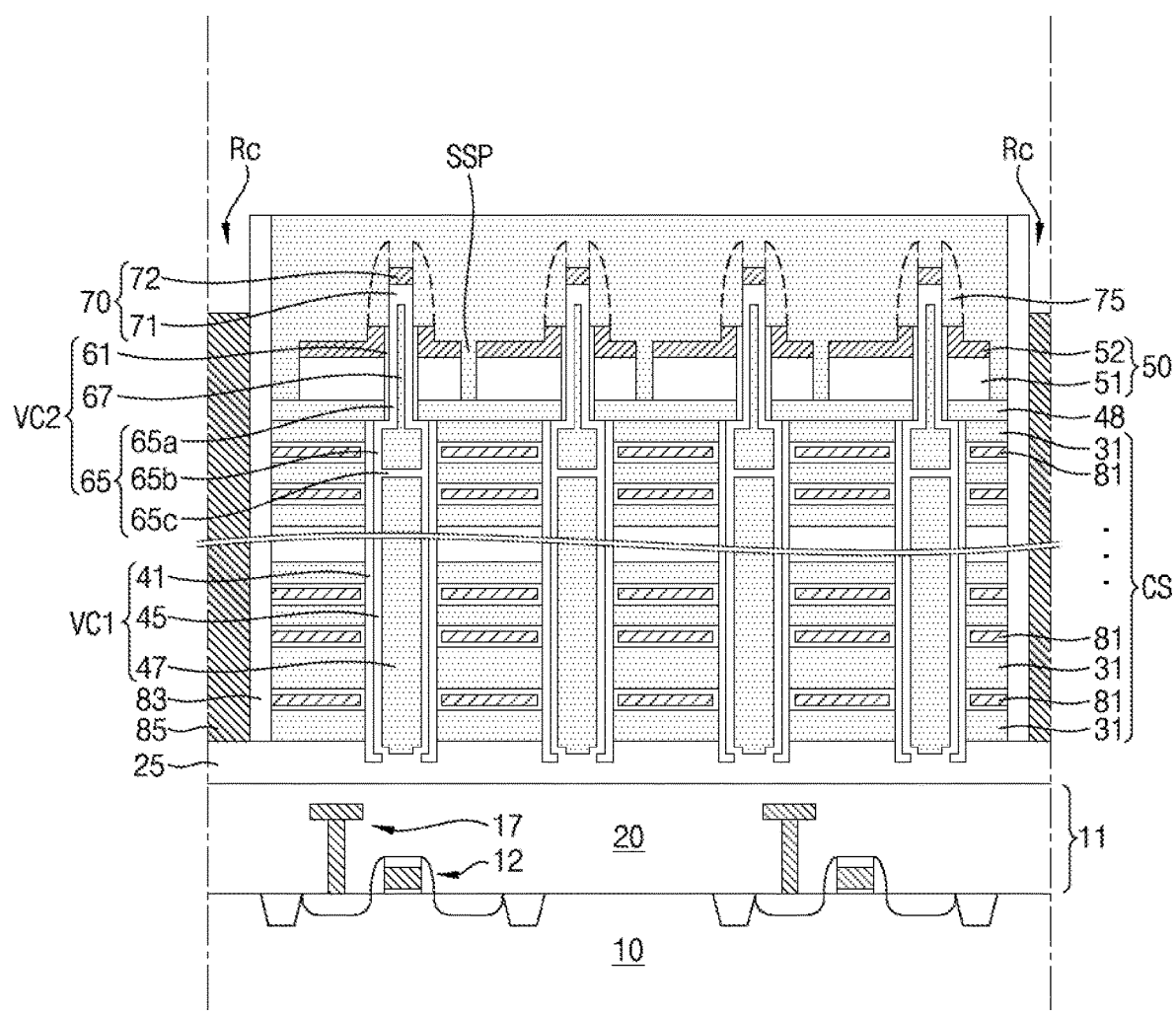
FIGS. 26 and 27 illustrate a method of manufacturing a three-dimensional memory device according to an exemplary embodiment of the present disclosure.
Figure 27:
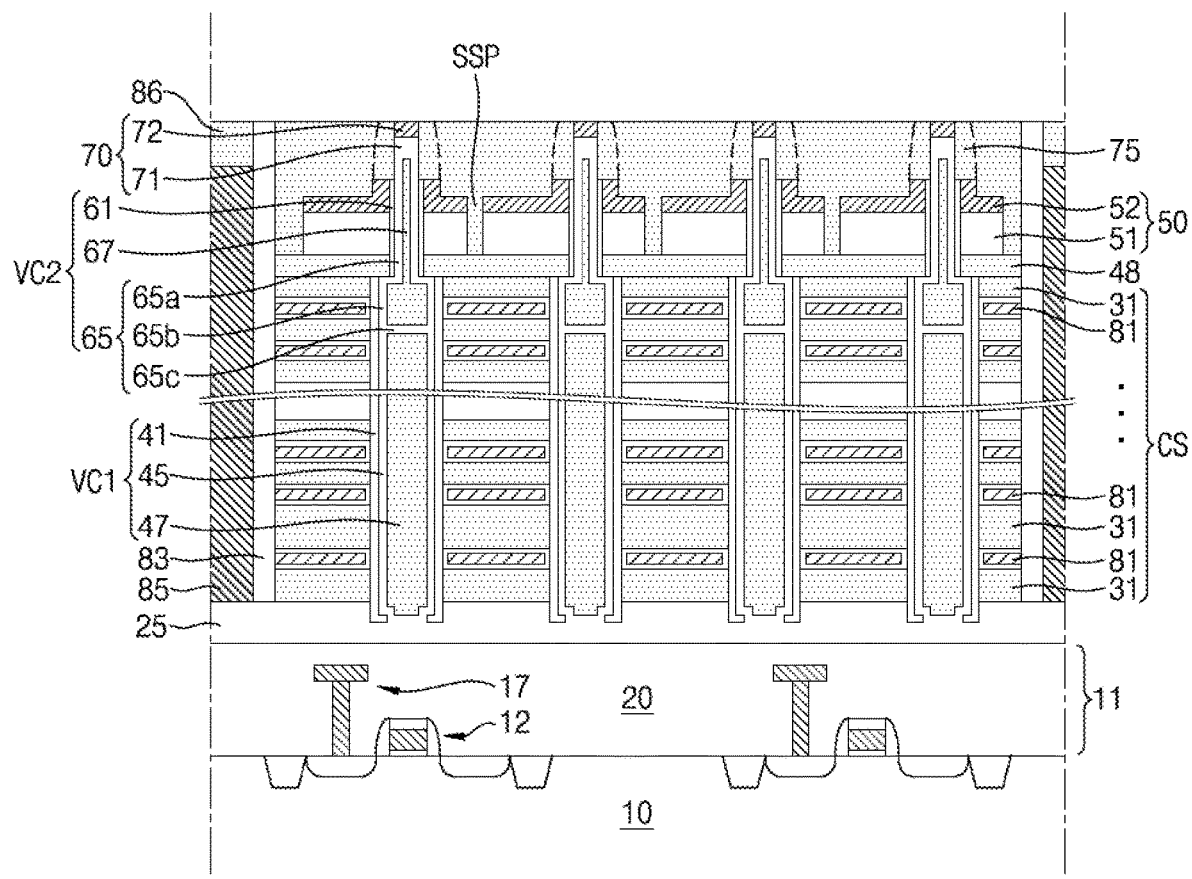

FIGS. 26 and 27 illustrate a method of manufacturing a three-dimensional memory device according to an exemplary embodiment of the present disclosure.

Referring to FIG. 26, a method of manufacturing the three-dimensional memory device according to an exemplary embodiment of the present disclosure, may include performing the processes described with reference to FIGS. 3 to 24, and further include performing an etch-back process to recess a top surface of the common source plug 85 to form a recessed space Rc. The top surface of the common source plug 85 may be located at a level sufficiently lower than the top surface of the upper pad pattern 72.

Referring to FIG. 27, the method may include filling a stopple insulator in the recessed space Rc and performing a planarization process such as CMP to expose a top surface of the upper pad pattern 72 and to form a stopple insulating layer 86. Subsequently, referring to FIG. 2B, the method may include forming a bit line BL on the upper insulating layer 80 in direct contact with the upper pad pattern 72.

Figure 28:
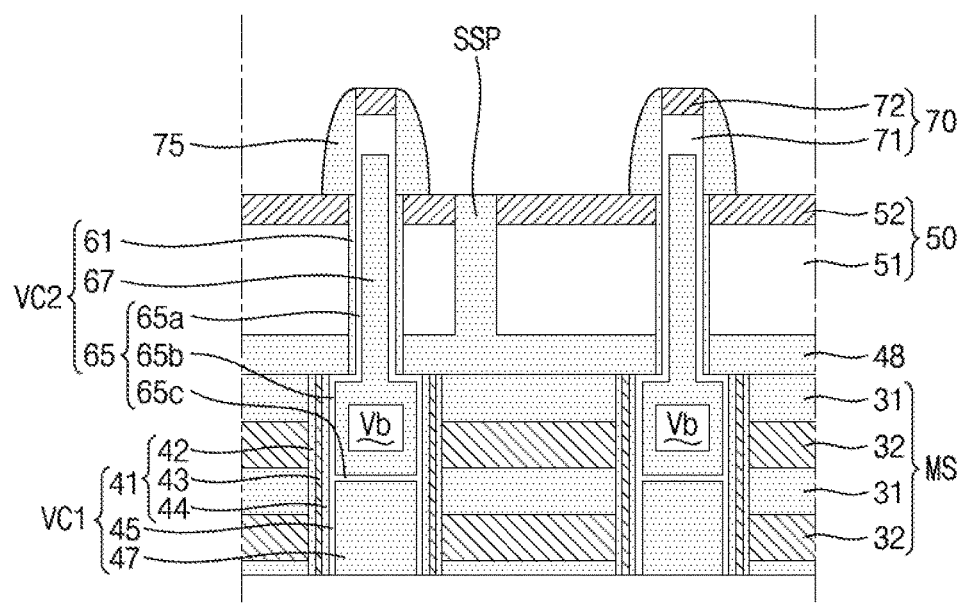
FIG. 28 is a diagram for describing a method of manufacturing a three-dimensional memory device according to an exemplary embodiment of the present disclosure.

FIG. 28 is a diagram for describing a method of manufacturing a three-dimensional memory device according to an exemplary embodiment of the present disclosure.

Referring to FIG. 28, the method of manufacturing the three-dimensional memory device according to an exemplary embodiment of the present disclosure, may include performing the processes described with reference to FIGS. 3 to 18, and further include performing a silicidation process to form a pad pattern 70 and a string selection line gate electrode 50. A top surface of the pad pattern 70 and a top surface of the string selection line gate electrode 50 may not be recessed. Since the silicidation processes are carried out on the upper portions of the preliminary string selection line gate electrode 50p, the volume expansion of the metal silicide may be confined to only allow upward expansion, and sideway expansion to narrow the spacing between adjacent components, for example, the neighboring upper string selection line gate electrodes 52, to form a bridge may not occur. Subsequently, the method may include performing the processes described with reference to FIGS. 21 to 25, and forming a bit line BL connected to the via plug 88 on the capping insulating layer 87 with reference to FIG. 2C.

In an exemplary embodiment of the present disclosure, the method may include performing the processes described with reference to FIGS. 21-24 and 26-27, and forming a bit line BL in direct contact with the upper pad pattern 72 on the upper insulating layer 80 with reference to FIG. 2D.

Figure 29:
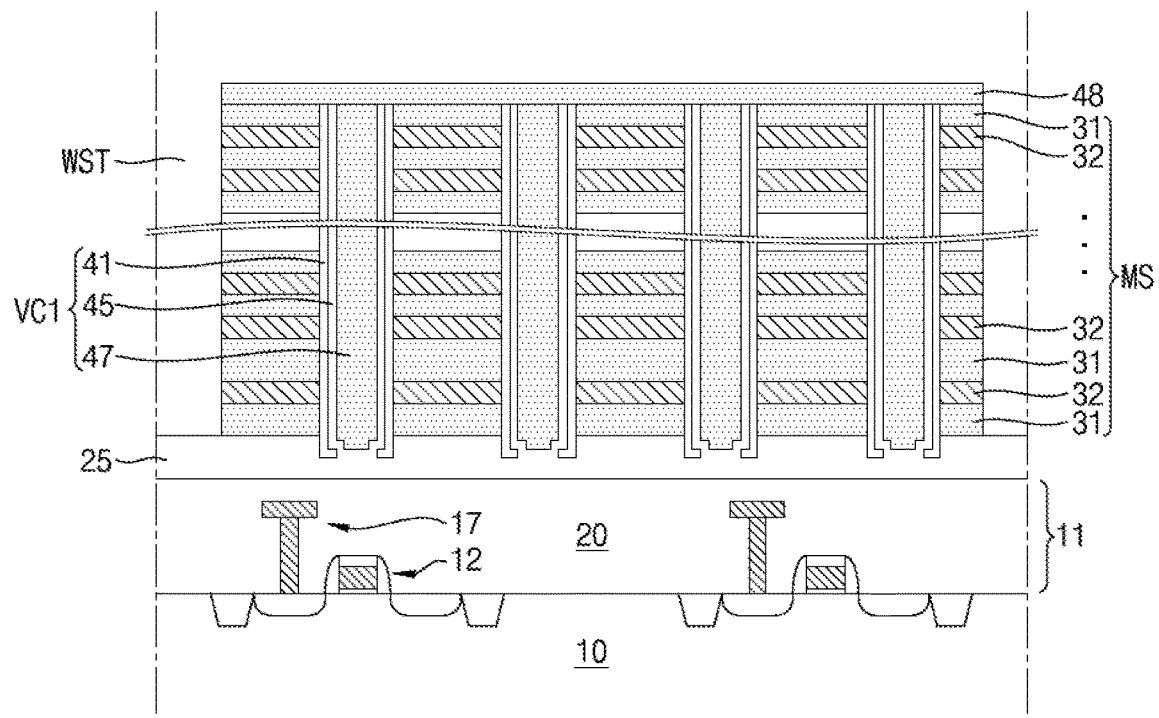
FIGS. 29 and 30 are diagrams for describing a method of forming a three-dimensional memory device according to an exemplary embodiment of the present disclosure.
Figure 30:
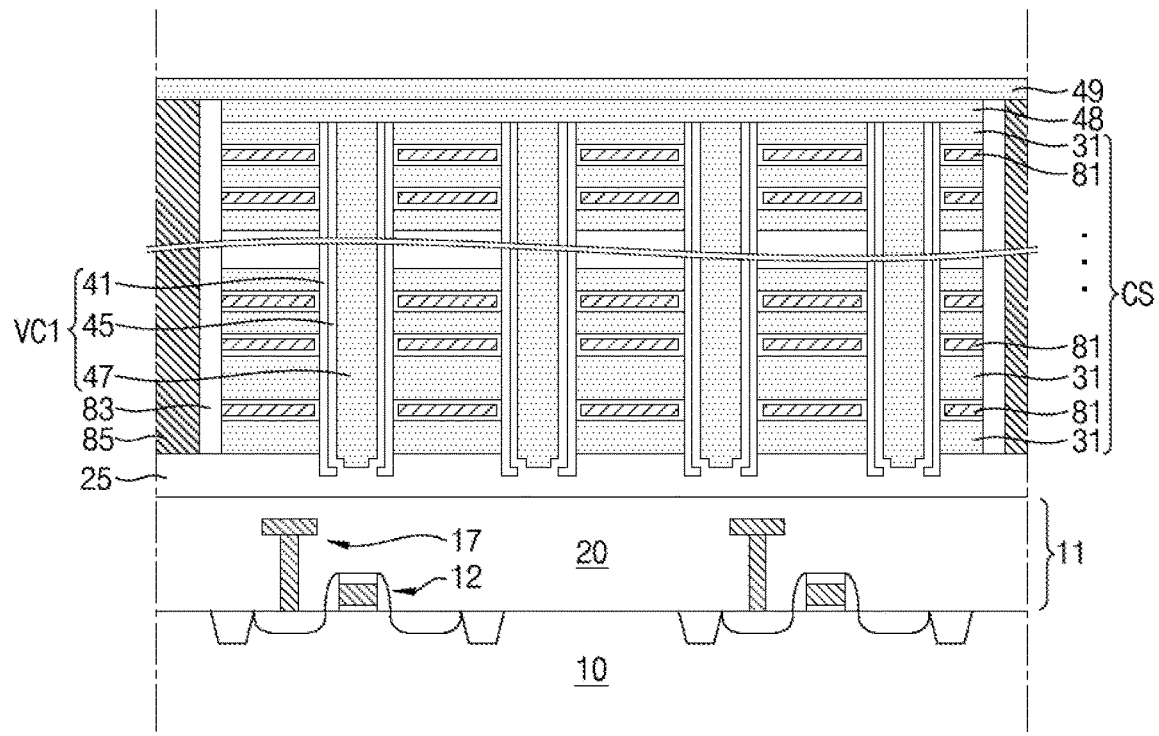

FIGS. 29 and 30 are diagrams for describing a method of forming a three-dimensional memory device according to an exemplary embodiment of the present disclosure.

Referring to FIG. 29, a method of manufacturing a three-dimensional memory device according to an exemplary embodiment of the present disclosure may include performing the processes described with reference to FIGS. 3 and 4, and forming a lower buffer insulating layer 48 on a lower vertical channel structure VC1 and a mold stack MS, and forming a word line separation trench WST.

Referring to FIG. 30, the method may include performing the processes described with reference to FIG. 23 to form word lines 81, and the processes described with reference to FIG. 24 to form a word line separation insulating layer 83 and a common source plug 85, and to form an upper buffer insulating layer 49. The upper buffer insulating layer 49 may include at least one of, for example, silicon oxide ($SiO_2$), silicon nitride ($Si_3N_4$), silicon oxynitride (SiON), or other insulators. In an exemplary embodiment of the present disclosure, the upper buffer insulating layer 49 may include a material the same as that of the lower buffer insulating layer 48.

Subsequently, the method may include performing the processes described with reference to FIGS. 5 to 21, and forming a via plug 88 and a bit line BL with reference to FIG. 2E.

In an exemplary embodiment of the present disclosure, the method may include performing the processes described with reference to FIGS. 5 to 21, and 27 (e.g., CMP process of 27), and with reference to FIG. 2F to form a bit line BL in direct contact with the upper pad pattern 72 on the upper insulating layer 80.

FIGS. 31 to 37 are views illustrating a method of forming a three-dimensional semiconductor device according to an exemplary embodiment of the present disclosure.

Figure 31:
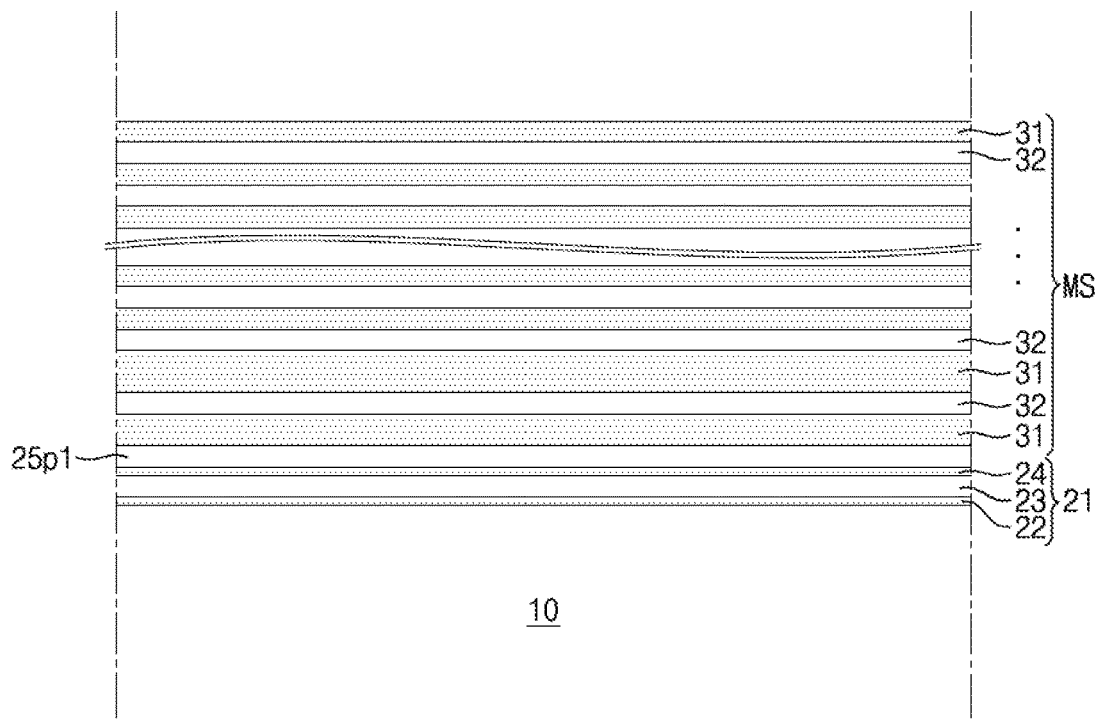
FIGS. 31 to 37 are views illustrating a method of forming a three-dimensional semiconductor device according to an exemplary embodiment of the present disclosure.

Referring to FIG. 31, a method of forming a three-dimensional semiconductor device according to an exemplary embodiment of the present disclosure may include forming a sacrificial source insulating layer 21 on a substrate 10, and a first preliminary common source layer 25p1 on the sacrificial source insulating layer 21. The sacrificial source insulating layer 21 may include a lower sacrificial source insulating layer 22, a middle sacrificial source insulating layer 23, and an upper sacrificial source insulating layer 24. For example, the lower sacrificial source insulating layer 22 and the upper sacrificial source insulating layer 24 may include silicon oxide ($SiO_2$), and the middle sacrificial source insulating layer 23 may include silicon nitride ($Si_3N_4$). The mold stack MS may include a mold layer 31 and a sacrificial layer 32. As mentioned above, the mold layer 31 may include silicon oxide ($SiO_2$), and the sacrificial layer 32 may include silicon nitride ($Si_3N_4$). The first preliminary common source layer 25p1 may include undoped poly-crystalline silicon (p-Si) or N-doped poly-crystalline silicon (p-Si).

Figure 32:
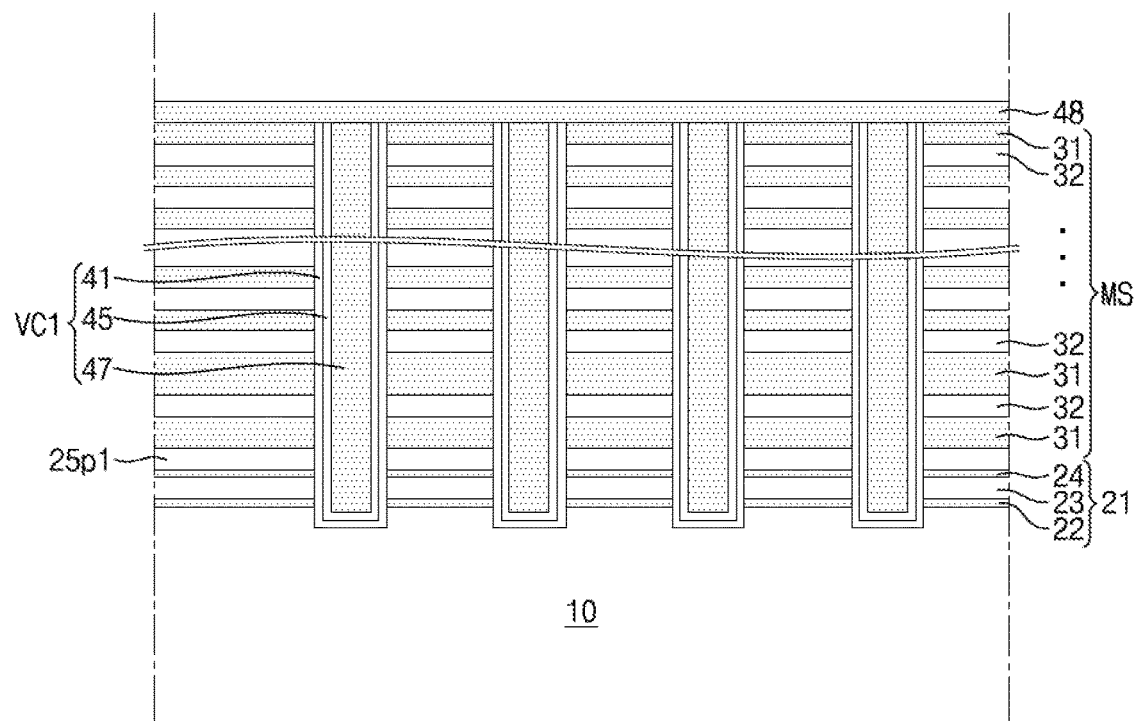

Referring to FIG. 32, the method may include forming a lower vertical channel structure VC1 vertically penetrating the mold stack MS, the first preliminary common source layer 25p1, and the sacrificial source insulating layer 21 to be connected to the substrate 10, and forming a lower buffer insulating layer 48 on the lower vertical channel structure VC1 and the mold stack MS. The forming of the lower vertical channel structure VC1 may include forming a vertical channel hole vertically penetrating the mold stack MS, the first preliminary common source layer 25p1, and the sacrificial source insulating layer 21 to expose the substrate 10, and forming a memory layer 41, a lower channel layer 45, and a lower gap-fill pattern 47 in the lower vertical channel hole. The lower buffer insulating layer 48 may include at least one of, for example, silicon oxide ($SiO_2$), silicon nitride ($Si_3N_4$), silicon oxynitride (SiON), silicon carbide (SiC), silicon germanium (SiGe), poly-crystalline silicon (p-Si), photoresist, or various other insulating materials. In an exemplary embodiment of the present disclosure, the lower buffer insulating layer 48 may include both a silicon oxide ($SiO_2$) layer and a silicon nitride ($Si_3N_4$) layer.

Figure 33:
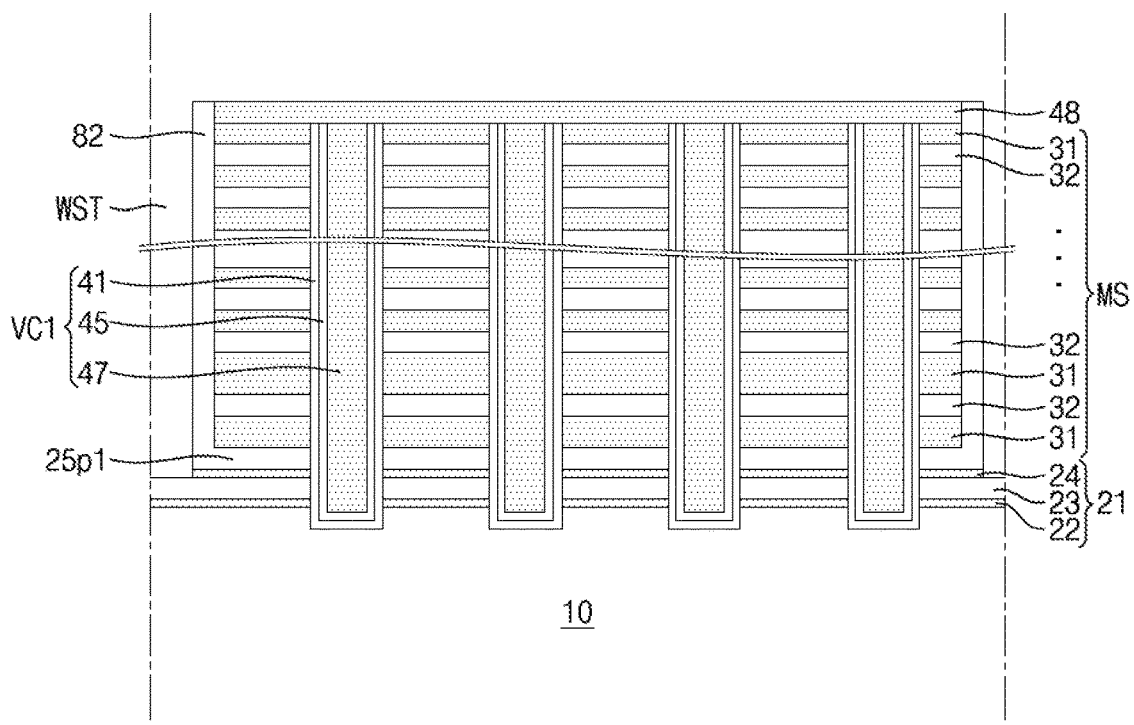

Referring to FIG. 33, the method may include forming a word line separation trench WST, and forming a sacrificial spacer 82 on an inner sidewall of the word line separation trench WST. The forming of the word line separation trench WST may include performing an etch process to vertically penetrate the lower buffer insulating layer 48, the mold stack MS, and the upper sacrificial source insulating layer 24, so that the word line separation trench WST may expose the middle sacrificial source insulating layer 23 of the sacrificial source insulating layer 21.

Figure 34:
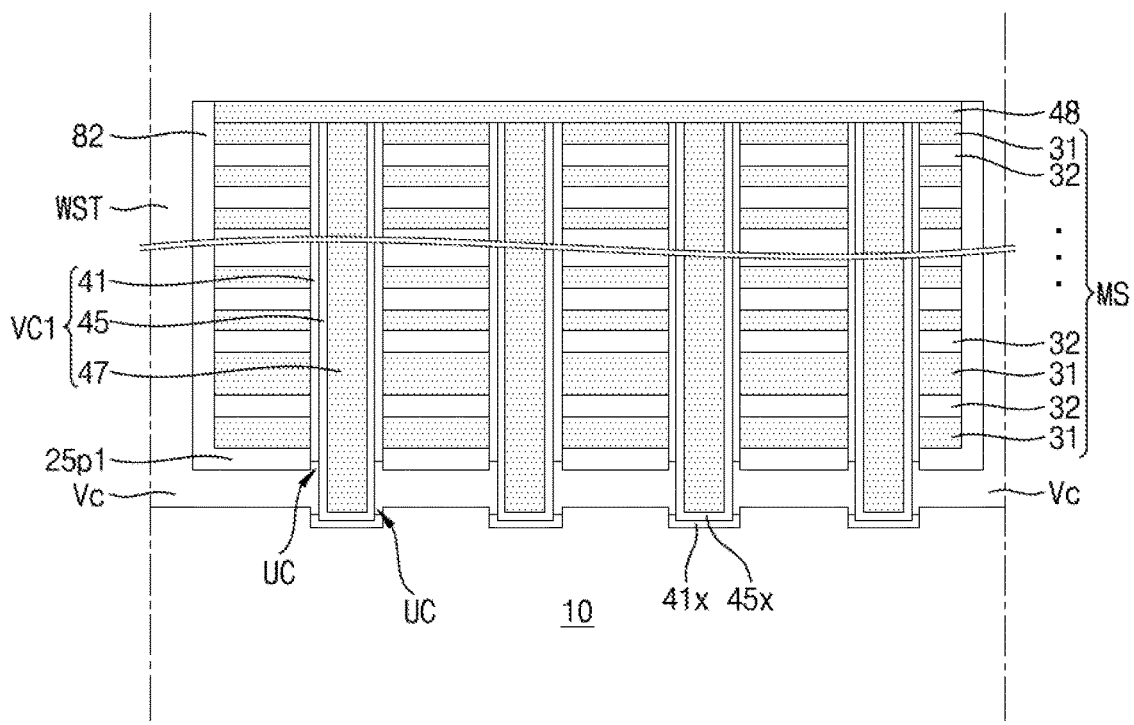

Referring to FIG. 34, the method may include completely removing the sacrificial source insulating layer 21 through the word line separation trench WST to form an empty space Vc. During the process, the memory layer 41 of the lower vertical channel structure VC1 may be partially removed. For example, an undercut UC may be formed. A bottom end of the memory layer 41 and a bottom end of the lower channel layer 45 may remain as the bottom memory layer 41x and a bottom lower channel layer 45x at positions lower than the top surface of the substrate 10.

Figure 35:
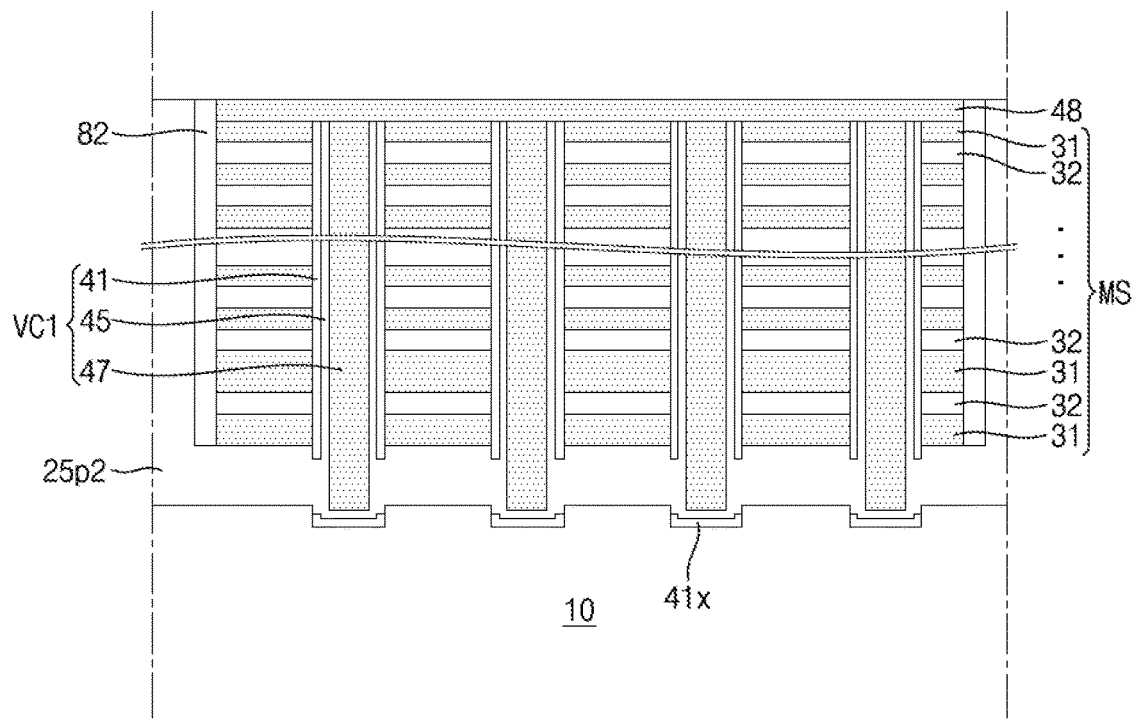

Referring to FIG. 35, the method may include forming poly-crystalline silicon (p-Si) in the empty space Vc where the sacrificial source insulating layer 21 is removed and in the word line separation trench WST to form a second preliminary common source layer 25p2. The poly-crystalline silicon (p-Si) may include N-doped poly-crystalline silicon (p-Si). Thus, the second preliminary common source layer 25p2 may include a sacrificial spacer 82. For example, the second preliminary common source layer 25p2 may have an "L" shape. The second preliminary common source layer 25p2 and the lower channel layer 45 of the lower vertical channel structure VC1 may be connected with each other. The poly-crystalline silicon (p-Si) may fill most of the word line separation trench WST.

Figure 36:
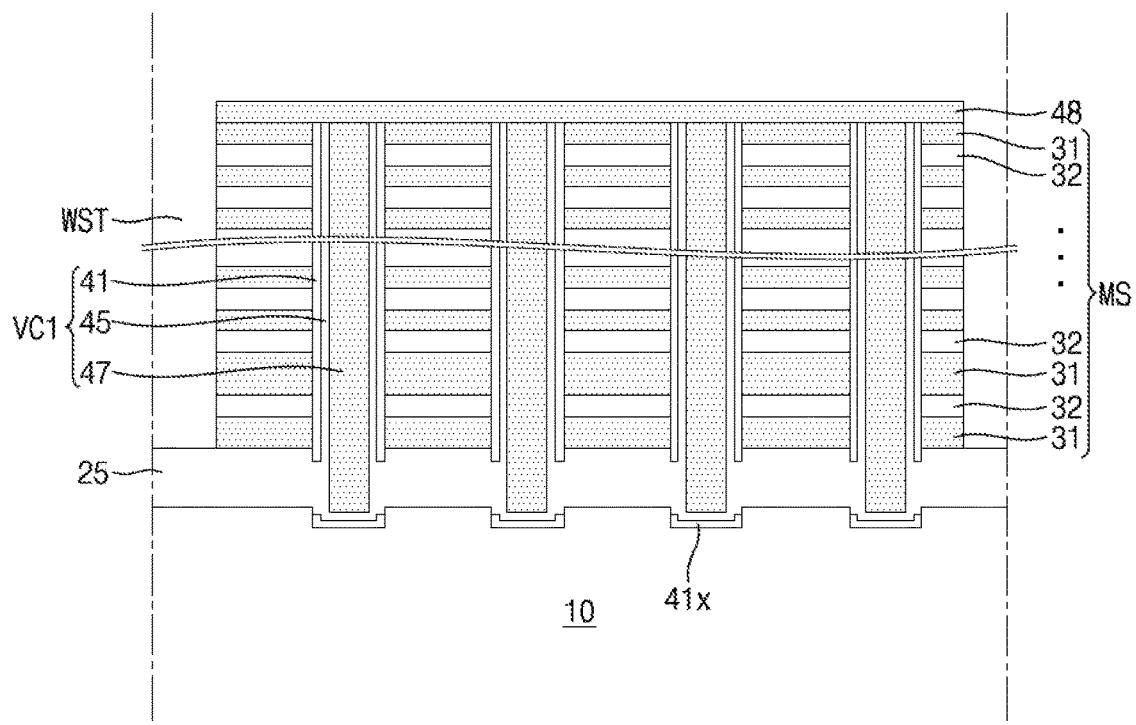

Referring to FIG. 36, the method may include removing the poly-crystalline silicon (p-Si) and sacrificial spacers 82 in the word line separation trench WST to form the common source layer 25. The mold stack MS may be exposed on the sidewall of the word line separation trench WST. A top surface of the common source layer 25 may be exposed on a bottom surface of the word line separation trench WST.

Figure 37:
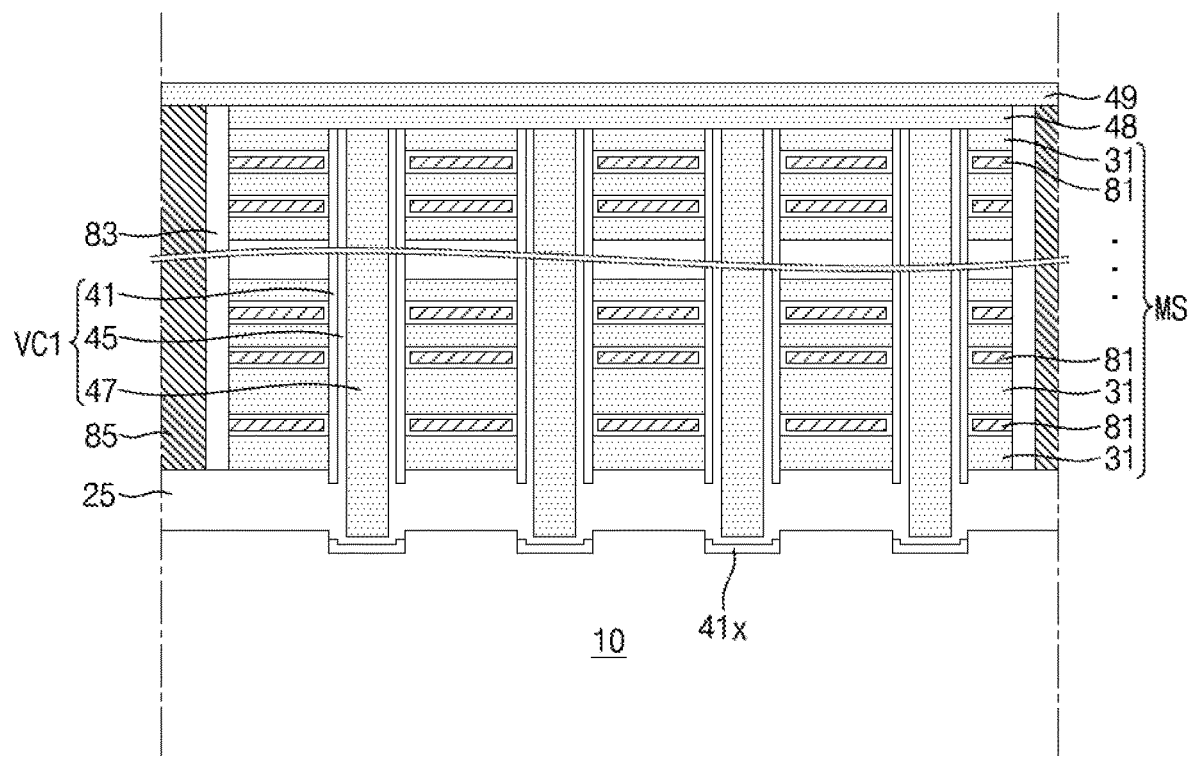

Referring to FIG. 37, the method may include forming a word line separation insulating layer 83 and a common source plug 85 in the word line separation trench WST, and forming an upper buffer insulating layer 49 on the top surfaces of the lower buffer insulating layer 48, the word line separation insulating layer 83, and the common source plug 85. The method may further include planarizing the top surfaces of the lower buffer insulating layer 48, the word line separation insulating layer 83, and the common source plug 85 to be coplanar. The upper buffer insulating layer 49 may include silicon oxide ($SiO_2$).

Subsequently, the method may include performing the processes described with reference to FIGS. 5 to 21, and forming a bit line BL with reference to FIG. 2G.

In an exemplary embodiment of the present disclosure, the method may include performing the processes described with reference to FIGS. 5 to 21, and forming a via plug 88, and a bit line BL with reference to FIG. 2H.

In an exemplary embodiment of the present disclosure, the method may include performing the processes described with reference to FIGS. 5 to 18, 20 to 21 and forming a via plug 88, and a bit line BL with reference to FIG. 2I. The recessing of the upper surfaces of the preliminary pad pattern 70p and the preliminary string selection line gate electrode 50p with reference to FIG. 19 may not be performed. The performing of the silicidation process to form a pad pattern 70 and a string selection line gate electrode 50 with reference to FIG. 20 may be clearly understood with reference to FIG. 28. For example, a top surface of the pad pattern 70 and a top surface of the string selection line gate electrode 50 may not be recessed as shown in FIG. 28.

A string selection line gate electrode of a three-dimensional memory device according to the exemplary embodiments of the present disclosure includes a silicide layer and thus has a lower resistance.

A pad pattern of the three-dimensional memory device according to the exemplary embodiments of the present disclosure includes a silicide layer and thus has a lower resistance.

Since the string selection line gate electrode of the three-dimensional memory device according to the exemplary embodiments of the present disclosure is formed in a recessed state, electrical bridging between adjacent components is prevented.

Although the present disclosure has been described in connection with some specific exemplary embodiments of the present disclosure illustrated in the accompanying drawings, it will be understood by those skilled in the art that various changes and modifications may be made to the exemplary embodiments without departing from the spirit and scope of the present disclosure as defined in the appended claims.

What is claimed is:
1. A three-dimensional memory device, comprising:
a substrate;
a cell stack disposed on the substrate;

a string selection line gate electrode disposed on the cell stack;

a string selection line separation pattern formed on a sidewall of the string selection line gate electrode;

a lower vertical channel structure vertically penetrating the cell stack;

an upper vertical channel structure vertically penetrating the string selection line gate electrode and being connected to the lower vertical channel structure; and a bit line disposed on the upper vertical channel structure, wherein the string selection line gate electrode includes a lower string selection line gate electrode and an upper string selection line gate electrode formed on an upper surface of the lower string selection line gate electrode, the lower string selection line gate electrode includes N-doped poly-crystalline silicon, and the upper string selection line gate electrode includes silicide, and the string selection line separation pattern is in direct contact with a sidewall of the lower string selection line gate electrode and a sidewall of the upper string selection line gate electrode.

2. The device of claim 1, wherein the lower vertical channel structure includes:

a lower gap-fill pattern;

a lower channel layer surrounding a sidewall of the lower gap-fill pattern; and a memory layer surrounding a sidewall of the lower channel layer, the upper vertical channel structure includes:

an upper gap-fill pattern;

an upper channel layer surrounding a sidewall of the upper gap-fill pattern; and an insulating liner surrounding a sidewall of the upper channel layer, and the upper vertical channel structure includes a lower portion having a first width and an upper portion having a second width, with the first width larger than the second width.

3. The device of claim 2, wherein the upper channel layer includes:

a first upper channel layer being in contact with the insulating liner;

a second upper channel layer being in contact with the memory layer of the lower vertical channel structure; and a third upper channel layer being in contact with the lower gap-fill pattern of the lower vertical channel structure.

4. The device of claim 3, wherein the first upper channel layer and the second upper channel layer extend vertically, and the third upper channel layer extends horizontally.

5. The device of claim 4, wherein the lower channel layer and the second upper channel layer are vertically aligned.

6. The device of claim 3, wherein the upper gap-fill pattern includes:

an upper portion surrounded by the first upper channel layer; and a lower portion surrounded by the second upper channel layer, wherein the upper portion of the upper gap-fill pattern has a third width narrower than a fourth width of the lower portion of the upper gap-fill pattern.

7. The device of claim 6, further comprising a void formed in the lower portion of the upper gap-fill pattern.

8. The device of claim 3, wherein the third upper channel layer is disposed between the lower gap-fill pattern and the upper gap-fill pattern.

9. The device of claim 2, further comprising a pad pattern disposed between the upper vertical channel structure and the bit line, wherein the pad pattern includes a lower pad pattern including N-doped poly-crystalline silicon and an upper pad pattern including silicide.

10. The device of claim 9, wherein the bit line is in direct contact with the upper pad pattern.

11. The device of claim 9, wherein an outer surface of the pad pattern and an outer surface of the upper channel layer are vertically aligned.

12. The device of claim 2, wherein the lower vertical channel structure includes a protruding portion protruding into the substrate, the lower vertical channel structure further includes a bottom memory layer disposed at the protruding portion, and the bottom memory layer is separate from the memory layer.

13. The device of claim 1, wherein the upper string selection line gate electrode includes:

a protruding portion located adjacent to the upper vertical channel structure; and a recessed portion spaced apart from the upper vertical channel structure, wherein the protruding portion has a disk shape in a plan view.

14. The device of claim 1, further comprising a common source layer disposed between the substrate and the cell stack, wherein the common source layer includes N-doped poly-crystalline silicon.

15. The device of claim 14, further comprising a logic circuit layer disposed between the substrate and the common source layer, wherein the logic circuit layer includes a transistor, a metal interconnection, and a lower insulating layer covering the transistor and the metal interconnection.

16. The device of claim 14, wherein the common source layer is connected to the substrate.

17. A three-dimensional memory device comprising:

a substrate;

a common source layer disposed on the substrate;

a cell stack disposed on the common source layer;

a string selection line gate electrode disposed on the cell stack;

a lower vertical channel structure vertically penetrating the cell stack and being connected to the common source layer;

an upper vertical channel structure vertically penetrating the string selection line gate electrode and being connected to the lower vertical channel structure;

a pad pattern disposed on the upper vertical channel structure; and a bit line disposed on the pad pattern, wherein the pad pattern includes a lower pad pattern and an upper pad pattern formed on the lower pad pattern, the lower pad pattern includes N-doped poly-crystalline silicon, and the upper pad pattern includes silicide.

18. The device of claim 17, wherein the string selection line gate electrode includes a lower string selection line gate electrode and an upper string selection line gate electrode formed on the lower string selection line gate electrode, the lower string selection line gate electrode includes N-doped poly-crystalline silicon, and the upper string selection line gate electrode includes silicide.

19. A three-dimensional memory device comprising:

a substrate;

a logic circuit layer disposed on the substrate, the logic circuit layer including a transistor, a metal interconnection, and a lower insulating layer covering the transistor and the metal interconnection;

a common source layer disposed on the logic circuit layer;

a cell stack disposed on the common source layer;

a lower vertical channel structure vertically penetrating the cell stack and being connected to the common source layer;

a string selection line gate electrode disposed on the cell stack and the lower vertical channel structure;

an upper vertical channel structure vertically penetrating the string selection line gate electrode and being connected to the lower vertical channel structure;

a pad pattern disposed on the upper vertical channel structure; and a bit line disposed on the pad pattern, wherein the pad pattern includes a lower pad pattern and an upper pad pattern formed on the lower pad pattern, the string selection line gate electrode includes a lower string selection line gate electrode and an upper string selection line gate electrode formed on the lower string selection line gate electrode, the lower pad pattern and the lower string selection line gate electrode include N-doped poly-crystalline silicon, and the upper pad pattern and the upper string selection line gate electrode include silicide.

* * * * *